United States Patent
Xie et al.

(10) Patent No.: US 12,328,859 B2
(45) Date of Patent: Jun. 10, 2025

(54) STACKED FET SRAM

(71) Applicant: International Business Machines Corporation, Armonk, NY (US)

(72) Inventors: Ruilong Xie, Niskayuna, NY (US); Carl Radens, LaGrangeville, NY (US); Albert M. Chu, Nashua, NH (US); Brent A. Anderson, Jericho, VT (US); Junli Wang, Slingerlands, NY (US); Julien Frougier, Albany, NY (US); Ravikumar Ramachandran, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 17/854,780

(22) Filed: Jun. 30, 2022

(65) Prior Publication Data
US 2024/0008242 A1    Jan. 4, 2024

(51) Int. Cl.
*H10B 10/00* (2023.01)

(52) U.S. Cl.
CPC .................. *H10B 10/125* (2023.02)

(58) Field of Classification Search
CPC . H10B 10/125; H01L 27/0207; H01L 27/124; H01L 29/78696; H01L 29/0673; H01L 27/0688; H01L 29/42392; H01L 27/092; H01L 21/02603; H01L 29/775; H01L 21/82385; H01L 21/8221; H01L 21/823842; H01L 29/4908; H01L 21/28088; H01L 21/823807; H01L 21/823871; H01L 23/5226; H10D 88/01; H10D 84/038; H10D 86/441; H10D 84/0167; H10D 88/00; H10D 30/6735; H10D 62/121; H10D 30/6739; H10D 30/6757; H10D 86/60; H10D 84/0177; H10D 84/85; H10D 84/0186;
(Continued)

(56) References Cited

U.S. PATENT DOCUMENTS

| | | |
|---|---|---|
| 10,192,819 B1 | 1/2019 | Chanemougame et al. |
| 10,192,867 B1 | 1/2019 | Frougier et al. |

(Continued)

FOREIGN PATENT DOCUMENTS

CN    112331664 B    11/2021

OTHER PUBLICATIONS

Ryckaert, J., et al., "The Complementary FET (CFET) for CMOS scaling beyond N3", 2018 Symposium on VLSI Technology Digest of Technical Papers, Date of Conference: Jun. 18-22, 2018, 2 pages.
(Continued)

*Primary Examiner* — Mouloucoulaye Inoussa
(74) *Attorney, Agent, or Firm* — Scully, Scott, Murphy & Presser, P.C.; Erik Johnson

(57) ABSTRACT

A semiconductor device is provided that includes at least one stacked FET device including two top transistors stacked over a single bottom transistor. The at least one stacked FET includes a full gate cut structure that is used to separate different device areas from each other, a top gate cut structure that used to separate the two top transistors, and a bottom gate cut structure that is used to provide the single bottom transistor. The at least one FET device can be used to provide a SRAM containing six transistors.

20 Claims, 27 Drawing Sheets

(58) Field of Classification Search
CPC .. H10D 64/251; H10D 84/017; H10D 62/151; H10D 62/292; B82Y 10/00
See application file for complete search history.

(56) References Cited

U.S. PATENT DOCUMENTS

| | | |
|---|---|---|
| 10,510,622 B1 | 12/2019 | Frougier et al. |
| 10,707,218 B2 | 7/2020 | Paul et al. |
| 10,756,096 B2 | 8/2020 | Paul et al. |
| 10,879,308 B1* | 12/2020 | Ando ................ H01L 21/02532 |
| 10,950,610 B2 | 3/2021 | Paul et al. |
| 11,043,495 B2 | 6/2021 | Lee et al. |
| 11,087,831 B2 | 8/2021 | Liaw |
| 11,152,359 B2 | 10/2021 | Kim et al. |
| 11,894,049 B1* | 2/2024 | Asenov ................ G11C 11/419 |
| 2019/0172828 A1* | 6/2019 | Smith .................... H10D 86/60 |
| 2020/0127054 A1* | 4/2020 | Ando .................... H10N 70/021 |
| 2021/0098049 A1 | 4/2021 | Yang et al. |
| 2021/0280582 A1* | 9/2021 | Lu ........................ H10D 84/038 |
| 2022/0181441 A1* | 6/2022 | Liebmann .............. H10D 88/00 |
| 2022/0336325 A1* | 10/2022 | Lai .................... H10D 30/6757 |

OTHER PUBLICATIONS

Chang, S.-W., et al., "First Demonstration of CMOS Inverter and 6T-SRAM Based on GAA CFETs Structure for 3D-IC Applications", 2019 IEEE International Electron Devices Meeting (IEDM), Dec. 2019, 4 pages.

* cited by examiner

STACKED FET SRAM

BACKGROUND

The present application relates to semiconductor technology, and more particularly to a semiconductor device including at least one stacked field effect transistor (FET) device including two top transistors stacked above a single bottom transistor.

In semiconductor technology, complementary field effect transistors (CFETs) have been touted as a possible next generation semiconductor device. A CFET includes a p-type field effect transistor (PFET) vertically stacked on top of an n-type field effect transistor (NFET) or vice versa. A CFET can utilize tri-gate or gate-all-around technology when stacking NFET and PFET nanosheets on top of each other. Stacking can permit smaller scale devices, with some structural gains.

SRAM cells can benefit from the smaller scaling and structural gains that are afforded by CFET architecture. A typical SRAM cell is made up of six transistors, and is often called a 6T SRAM cell. Each bit in the cell is stored on four transistors that form two cross-coupled inverters. This storage cell has two stable states which are used to denote 0 and 1. Two additional access transistors serve to control the access to a storage cell during read and write operations. In addition to 6T SRAM, other kinds of SRAM chips use 4, 8, 10 (4T, 8T, 10T SRAM), or more transistors per bit.

SUMMARY

A semiconductor device is provided that includes at least one stacked FET device including two top transistors stacked over a single bottom transistor. The at least one stacked FET includes a full gate cut structure that is used to separate different device areas from each other, a top gate cut structure that used to separate the two top transistors, and a bottom gate cut structure that is used to provide the single bottom transistor. The at least one FET device can be used to provide a SRAM containing six transistors.

In one aspect of the present application, a semiconductor device is provided. In one embodiment, the semiconductor device includes a first stacked field effect transistor device present in a first device area, the first stacked field effect transistor device including two top transistors stacked above a single bottom transistor. The semiconductor device further includes a full gate cut structure located at the periphery of the first device area, and separating the first device area from an adjacent second device area, a top gate cut structure separating the two top transistors from each other, and a bottom gate cut structure located laterally adjacent to the single bottom transistor and beneath one of the top transistors.

In addition to providing a semiconductor device, the present application also provides a method of forming the same. The method of the present application will become more apparent be the drawings and detailed discussion section to follow.

DETAILED DESCRIPTION

Figure 1:
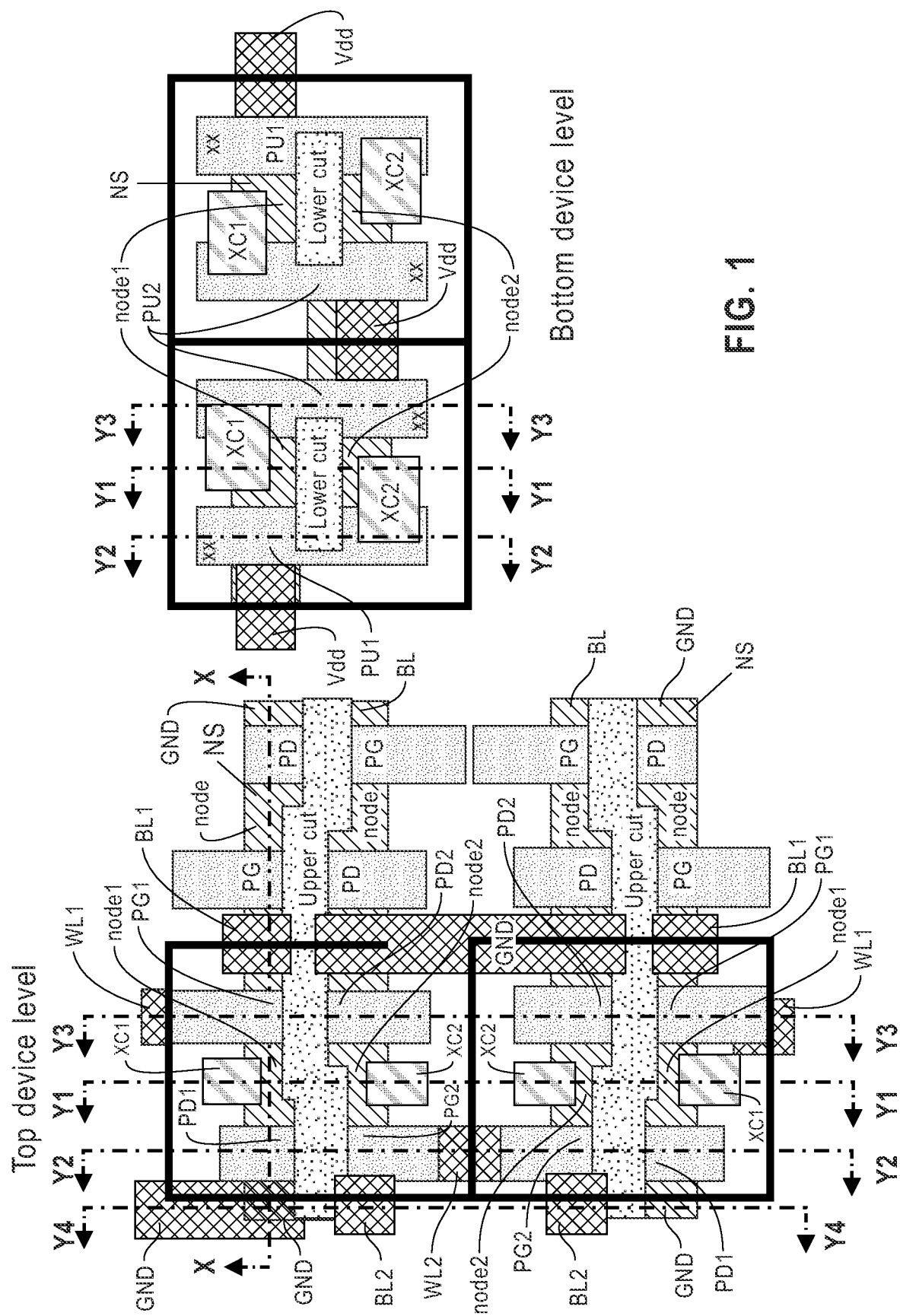
FIG. 1 is a top down view showing a SRAM design layout using CFET architecture in accordance with the present application, including cuts X-X, Y1-Y1, Y2-Y2, Y3-Y3 and Y4-Y4.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a SRAM design layout using CFET architecture in accordance with the present application, including cuts X-X, Y1-Y1, Y2-Y2, Y3-Y3 and Y4-Y4. In FIG. 1, cut X-X is a cross sectional view through one active device region, cut Y1-Y1 is a cross sectional view through a first source/drain region that is located between a first set of gate structures and a second set of gate structures that are opposite the first set of gate structures, cut Y2-Y2 is a cross sectional view through the first set of gate structures, cut Y3-Y3 is a cross sectional view through the second set of gate structures, and cut Y4-Y4 is a cross sectional view through a second source/drain region that is located on a side of the first set of gate structures that is opposite the side of the first set of gate structures that include the first source/drain region.

In FIG. 1, the SRAM design layout includes CFET architecture in which a top device level is stack above a bottom device level. In the drawing, PU1 denotes a first pull-up transistor, PU2 denotes a second pull-up transistor, PG denotes a base pass gate transistor, PG1 denotes a first pass gate transistor, PG2 denotes a second pass gate transistor, PD denotes a base pull-down transistor, PD1 denotes a first pull-down transistor, PD2 denotes a second pull-down transistor, NS denotes a nanosheet device region, node denotes the node for SRAM, node 1 and node 2 refer to the intersection point of the shared S/D of one PD/PU pair with the shared gate of the other PD/PU pair, GND denotes a ground region, BL denotes a base bit line, BL1 denotes a first bit line, BL2 denotes a second bit line, WL1 denotes a first word line, W2 denotes a second word line, XC1 and XC2 referred to a first cross couple contact structure and a second cross couple contact structure, respectively, Vdd is a power supply source, xx denotes a gate contact structure, upper cut refers to a gate cut region in the top device level, and lower cut denotes a refers to a gate cut region in the top device level.

Figure 2:
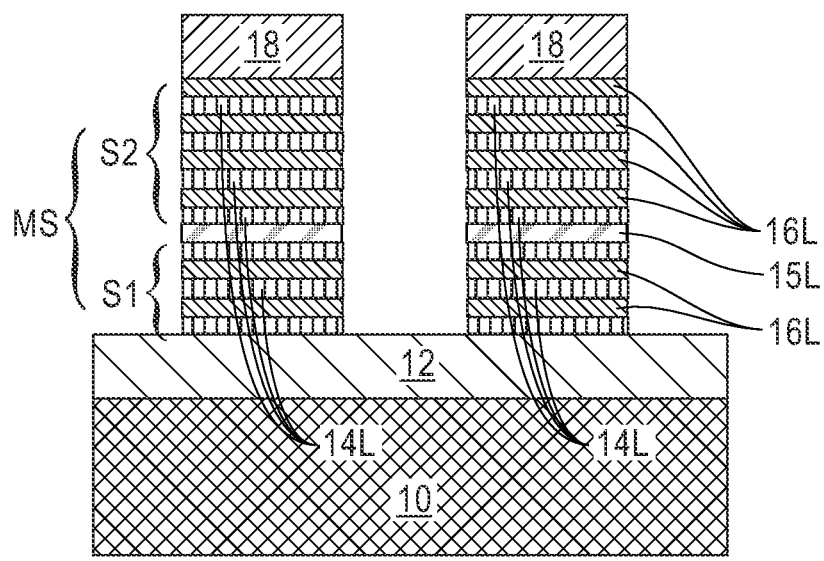
FIG. 2 is a cross sectional view of an exemplary semiconductor structure through Y2-Y2 shown in FIG. 1 that can be employed in the present application, the exemplary semiconductor structure including a pair of vertical material stacks capped with a hard mask and located on a surface of a dielectric material layer, each vertical material stack including a bottom material stack and a top material stack that are separated by a placeholder semiconductor material layer.

Referring now to FIG. 2, there is illustrated an exemplary semiconductor structure through Y2-Y2 shown in FIG. 1 that can be employed in the present application. The exemplary semiconductor structure of FIG. 2 includes a pair of spaced apart vertical material stacks, MS, capped with a hard mask 18 and located on a surface of a dielectric material layer 12. The dielectric material layer 12 is located on a semiconductor substrate 10. Each vertical material stack, MS, includes a bottom material stack, S1, and a top material stack, S2, that are separated by a placeholder semiconductor material layer 15; the bottom material stack, S1, the placeholder semiconductor material layer 15, and the top material stack, S2, of each vertical material stack, MS, are oriented in a vertical manner to each other.

The semiconductor substrate 10 that can be used in the present application includes at least one semiconductor material having semiconductor properties. Illustrative examples of semiconductor materials that can be used in the present application include, but are not limited to, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials (e.g., a multilayered stack of Si and SiGe). In one embodiment (depicted in the drawings of the present application), the semiconductor substrate 10 is entirely composed of at least one semiconductor material.

The dielectric material layer 12 is composed of any dielectric material having electrical insulating properties. Illustrative examples of dielectric materials that can be employed in providing the dielectric material layer 12 include, but are not limited to, silicon dioxide, silicon nitride, silicon oxynitride, or boron nitride. In some embodiments, the dielectric material layer 12 can be formed on a surface of the semiconductor substrate 10 utilizing a deposition process such as, for example, chemical vapor deposition (CVD), plasma enhanced chemical vapor deposition (PECVD), physical vapor deposition (PVD) or atomic layer deposition (ALD). In yet other embodiments, the dielectric material layer 12 can be formed on a surface of the semiconductor substrate 10 utilizing a thermal process such as, for example, thermal oxidation and/or thermal nitridation. The dielectric material layer 12 can have a thickness from 5 nm to 50 nm; although other thicknesses are contemplated and can be employed as the thickness of the dielectric material. In some embodiments, the dielectric material layer 12 is component of a semiconductor-on-insulator (SOI) substrate, in which semiconductor substrate 10 is a bottom semiconductor material layer of the SOI substrate, the dielectric material layer 12 is the buried insulator layer of the SOI substrate, and the top semiconductor material layer is thinned down and converted to a sacrificial semiconductor material layer (not shown), such as SiGe by a SiGe condensation process. In such an embodiment, the thinned top semiconductor layer can be used as a bottom sacrificial semiconductor material layer 14L of the vertical material stacks shown in FIG. 2 of the present application.

As mentioned above, each vertical material stack, MS, includes bottom material stack, S1, and top material stack, S2, that are separated by placeholder semiconductor material layer 15. The bottom material stack, S1, and the top material stack, S2, include alternating sacrificial semiconductor material layers 14L and semiconductor channel material layers 16L stacked one atop the other. The bottom material stack, S1, includes n number of semiconductor channel material layers 16L, and n+1 number of sacrificial semiconductor material layers 14L, wherein n is an integer starting from 1. The top material stack, S2, includes m number of semiconductor channel material layers 16L, and m number of sacrificial semiconductor material layers 14L, wherein m is an integer starting from 1.

Each sacrificial semiconductor material layer 14L in the bottom and top material stacks is composed of a first semiconductor material, while each semiconductor channel material layer 16L in the bottom and top material stacks is composed of a second semiconductor material that is compositionally different from the first semiconductor material. In some embodiments, the second semiconductor material that provides each semiconductor channel material layer 16L within the bottom material stack, S1, is a semiconductor material that is capable of providing high channel mobility for n-type FET devices, while the each semiconductor channel material layer 16L within the top material stack, S2, is a semiconductor material that is capable of providing high channel mobility for p-type FET devices. Alternatively, the second semiconductor material that provides each semiconductor channel material layer 16L within the bottom material stack, S1, is a semiconductor material that is capable of providing high channel mobility for p-type FET devices, while the each semiconductor channel material layer 16L within the top material stack, S2, is a semiconductor material that is capable of providing high channel mobility for n-type FET devices.

The first semiconductor material that provides each sacrificial semiconductor material layer 14L, and the second semiconductor material that provides each semiconductor channel material layer 16L can include one of the semiconductor materials mentioned above for the semiconductor substrate 10. In one example, the first semiconductor material that provides each sacrificial semiconductor material layer 14L is composed of a silicon germanium alloy, and the second semiconductor material that provides each semiconductor channel material layer 16L is composed of silicon. Other combinations of semiconductor materials are possible as long as the first semiconductor material that provides each sacrificial semiconductor material layer 14L is compositionally different from the second semiconductor material that provides each semiconductor channel material layer 16L. Each sacrificial semiconductor material layer 14L can have a thickness from 4 nm to 20 nm, while each semiconductor channel material layer 16L can have a thickness from 4 nm to 15 nm. Other thicknesses for the sacrificial semiconductor material layers 14L and the semiconductor channel material layers 16L are contemplated and can thus be used in the present application as the thickness of the sacrificial semiconductor material layers 14L and as the thickness of the semiconductor channel material layers 16L.

The placeholder semiconductor material layer 15 is composed of a third semiconductor material that is compositionally different from the first semiconductor material that provides the sacrificial semiconductor material layers 14L and the second semiconductor material that provides the semiconductor channel material layers 16L. In one example, the placeholder semiconductor material layer 15 is composed of a SiGe alloy having a Ge content of about 60 atomic percent, each sacrificial semiconductor material layer 14L is composed of a SiGe ally having a Ge content of about 30 atomic percent, and each semiconductor channel material layer 16L is composed of Si. The placeholder semiconductor material layer 15 can have a thickness from 6 nm to 15 nm, although other thicknesses can also be used as the thickness of the placeholder semiconductor material layer 15.

The hard mask 18 that is present on each vertical material stack, MS, is composed of a dielectric hard mask material such as, for example, silicon dioxide, silicon nitride, or silicon oxynitride; typically, but not necessarily always, the hard mask material that provides the hard mask 18 is compositionally different from the dielectric material layer 12.

The exemplary structure shown in FIG. 2 can be formed by epitaxially growing (see definition herein below) in an appropriate sequence to provide the vertical material stack, MS, shown in FIG. 2, the first semiconductor material, the second semiconductor material, and the third semiconductor material. A hard mask material is then formed atop the epitaxially grown first, second and third semiconductor materials and thereafter the as deposited hard mask material and the epitaxially grown first, second and third semiconductor materials are patterned by lithography and etching to form vertical material stacks MS. The hard mask can be formed by a deposition process including, for example, CVD, PECVD, PVD or ALD.

Referring now to FIGS. 3A-3D, there are illustrated the exemplary structure shown in FIG. 2 and through Y1-Y1, Y2-Y2, Y3-Y3 and X-X, respectively, after removing the hard mask 18 from atop each material stack, MS, forming a sacrificial gate structure 20 on each vertical material stack, MS, removing the placeholder semiconductor material layer from the each vertical material stack, MS, forming a dielectric spacer 22 laterally adjacent to the sacrificial gate structure and a dielectric device separating material layer in the spaced previously occupied by the placeholder semiconductor material layer, converting each vertical material stack, MS, into a nanosheet-containing material stack including a bottom nanosheet-containing material stack, NS1, and a top nanosheet-containing material stack, NS2, that are separated by a placeholder semiconductor material nanosheet (each of the top and bottom nanosheet-containing material stacks, NS1 and NS2, includes alternating sacrificial semiconductor material nanosheets 14 and semiconductor channel material nanosheets 16), forming inner spacers 26 and forming a bottom source/drain (S/D) region 28.

The hard mask 18 can be removed from each of the vertical material stacks, MS, utilizing a material removal process such as, for example, wet etching or dry etching. The material removal process stops on a topmost semiconductor channel material layer 16L that is present in the top material stack, S2.

The sacrificial gate structure 20, which is formed on a portion of each vertical material stack, MS, includes at least a sacrificial gate material. In some embodiments, the sacrificial gate structure 20 can include a sacrificial gate dielectric material located beneath the sacrificial gate material. A sacrificial gate cap can be located on the sacrificial gate material. The sacrificial gate structure 20 can be formed by depositing blanket layers of a sacrificial gate dielectric material (such as, for example, silicon dioxide), a sacrificial gate material (such as, for example, polysilicon or a metal), and a dielectric hard mask material (such as, for example, silicon nitride); note that the dielectric hard mask material provides a sacrificial gate cap. In some embodiments, the depositing of a blanket layer of the sacrificial gate dielectric material and/or the dielectric hard mask material can be omitted. The depositing of the blanket layers of the dielectric hard mask material, sacrificial gate material, and sacrificial gate dielectric material includes, but is not limited to, CVD, PECVD, PVD, ALD or any combination of such deposition processes. After forming the blanket layers of sacrificial gate dielectric material, sacrificial gate material, and hard mask material, a patterning process (including lithography and etching) is used to convert the blanket layer of hard mask material into a sacrificial gate cap and the blanket layers of the sacrificial gate dielectric material and the sacrificial gate dielectric material into the sacrificial gate structure 20.

After sacrificial gate structure 20 formation, the placeholder semiconductor material layer 15 is removed from each vertical material stack, MS, by utilizing an etching process that is selective in removing the third semiconductor material layer that provides the placeholder semiconductor material layer 15. A space (or gap) is formed between the bottom material stack, S1, and the top material stack, S2. The top material stack, S2, is not floating since it is anchored by the sacrificial gate structure 20.

Next, a dielectric spacer 22 is formed laterally adjacent to the sacrificial gate structure 20 and a dielectric device separating material layer (not shown) is formed in the spaced previously occupied by the placeholder semiconductor material layer 15. The dielectric spacer 22 and the dielectric device separating material layer are composed of a dielectric spacer material (i.e., a first dielectric spacer material) such as, for example, silicon dioxide, silicon nitride, SiBCN, SiOCN, etc. The dielectric spacer 22 and the dielectric device separating material layer are formed simultaneously by deposition of the dielectric spacer material, followed by a spacer etch. The dielectric spacer 20 is present along a sidewall of the sacrificial gate structure 20. In embodiments, the dielectric spacer 20 can be I-shaped, and have a topmost surface that is coplanar with a topmost surface of the sacrificial gate structure 20.

After forming the dielectric spacer 22 and the dielectric device separating material layer, each vertical material stack, MS, that now includes the dielectric device separating material layer is converted into a nanosheet-containing material stack including a bottom nanosheet-containing material stack, NS1, and a top nanosheet-containing material stack, NS2, that are separated by a dielectric material nanosheet 24 (each of the top and bottom nanosheet-containing material stacks, NS1 and NS2, includes alternating sacrificial semiconductor material nanosheets 14 and semiconductor channel material nanosheets 16). The converting includes an etching process in which the sacrificial gate structure 20 and the dielectric spacer 22 are used as an etch mask. In the present application, the non-etched (i.e., remaining) portion of each sacrificial semiconductor material layer 14L is referred to as a sacrificial semiconductor material nanosheet 14, the non-etched (i.e., remaining) portion of each semiconductor channel material layer 16L is referred to as a semiconductor channel material nanosheet 16, and the non-etched (i.e., remaining) portion of the dielectric device separating material layer is referred to as dielectric material nanosheet 24.

Each sacrificial semiconductor material nanosheet 14 has a same thickness as mentioned above for the sacrificial semiconductor material layers 14L, and a lateral width that is less than the lateral width of the original sacrificial semiconductor material layer 14L. Each semiconductor channel material nanosheet 16 has a same thickness as mentioned above for the semiconductor channel material layers 16L, and a lateral width that is less than the lateral width of the original semiconductor channel material layer 16L, and the dielectric material nanosheet 24 has a same thickness as mentioned above for the placeholder semiconductor material layer 15, and a lateral width that is less than the lateral width of the original placeholder semiconductor material layer 15.

Next, inner spacer 26 are formed. The inner spacers 26 are formed by first recessing each of the sacrificial semiconductor material nanosheets 14 to form an inner spacer gap adjacent to the ends of each recessed sacrificial semiconductor material nanosheet 14. After this recessing step, the remaining (i.e., recessed) sacrificial semiconductor material nanosheets 14 have a reduced lateral width as compared to the width of the original sacrificial semiconductor material nanosheets 14. The recessing includes a lateral etching process that is selective in removing the sacrificial semiconductor material nanosheets 14 relative to the semiconductor channel material nanosheets 16 and the dielectric material nanosheet 24. Next, inner spacers 26 are formed by conformal deposition of a second dielectric spacer material, followed by isotropic etching. The second dielectric spacer material can be compositionally the same as, or compositionally different from, the first dielectric spacer material that provides dielectric spacer 20 and the dielectric device separating material layer. Each inner spacer 26 has a first end sidewall in direct physical contact with the recessed sacrificial semiconductor material nanosheet 14, and a second end sidewall, opposite the first end sidewall, that is vertically aligned to the outer wall of the dielectric spacer 20 and an end sidewall of each semiconductor channel material nanosheet 16.

Figure 3A:
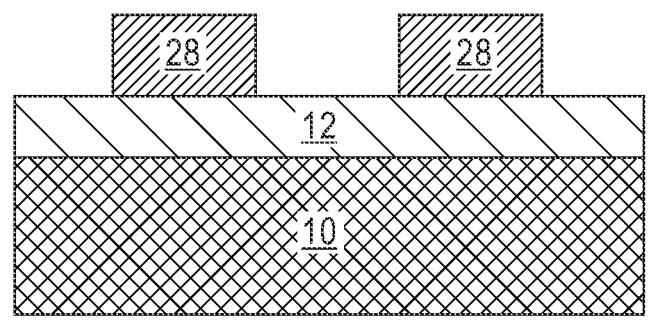
FIGS. 3A-3D are cross sectional views of the exemplary structure shown in FIG. 2 and through Y1-Y1, Y2-Y2, Y3-Y3 and X-X, respectively, after removing the hard mask from atop each vertical material stack, forming a sacrificial gate structure on each vertical material stack, removing the placeholder semiconductor material layer from the each vertical material stack, forming a dielectric spacer laterally adjacent to the sacrificial gate structure and a dielectric device separating material layer in the spaced previously occupied by the placeholder semiconductor material layer, converting each vertical material stack into a nanosheet-containing material stack including a bottom nanosheet-containing material stack and a top nanosheet-containing material stack that are separated by a dielectric material nanosheet (each of the top and bottom nanosheet-containing material stacks includes alternating sacrificial semiconductor material nanosheets and semiconductor channel material nanosheets), forming inner spacers and forming a bottom source/drain (S/D) region.
Figure 3B:
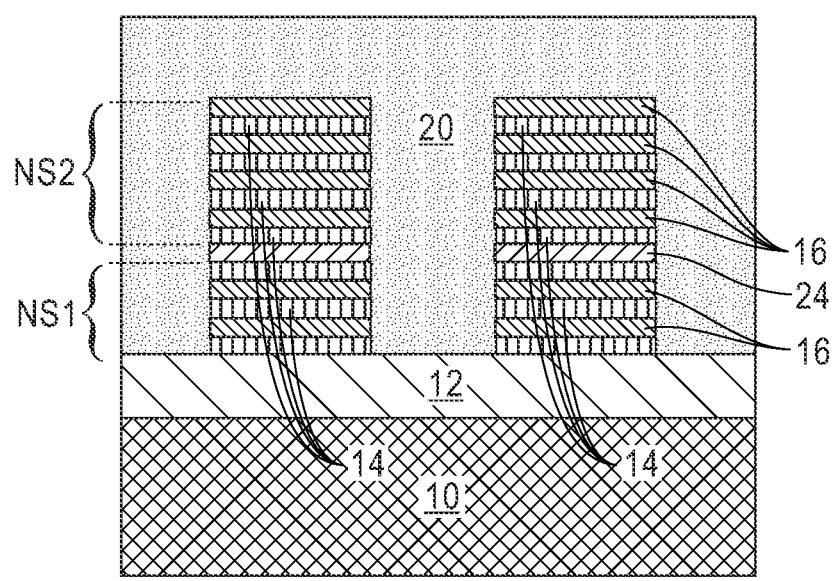
Figure 3C:
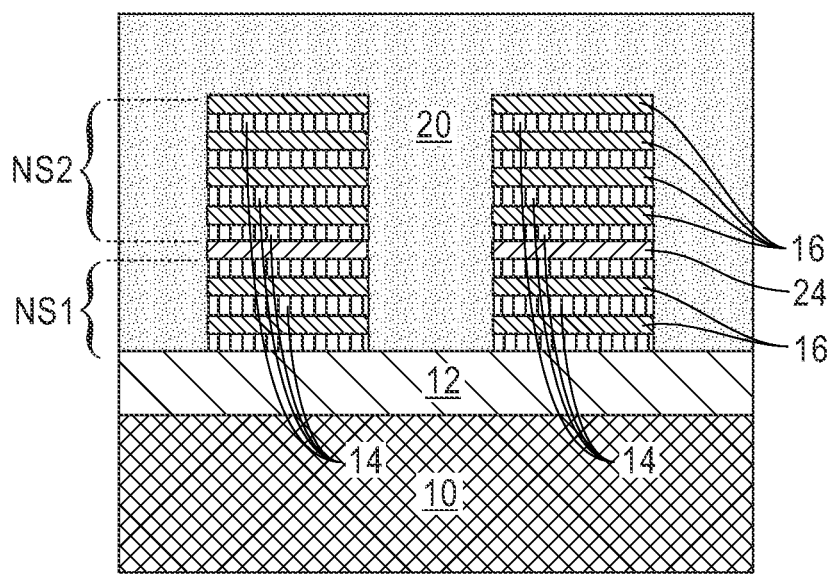
Figure 3D:
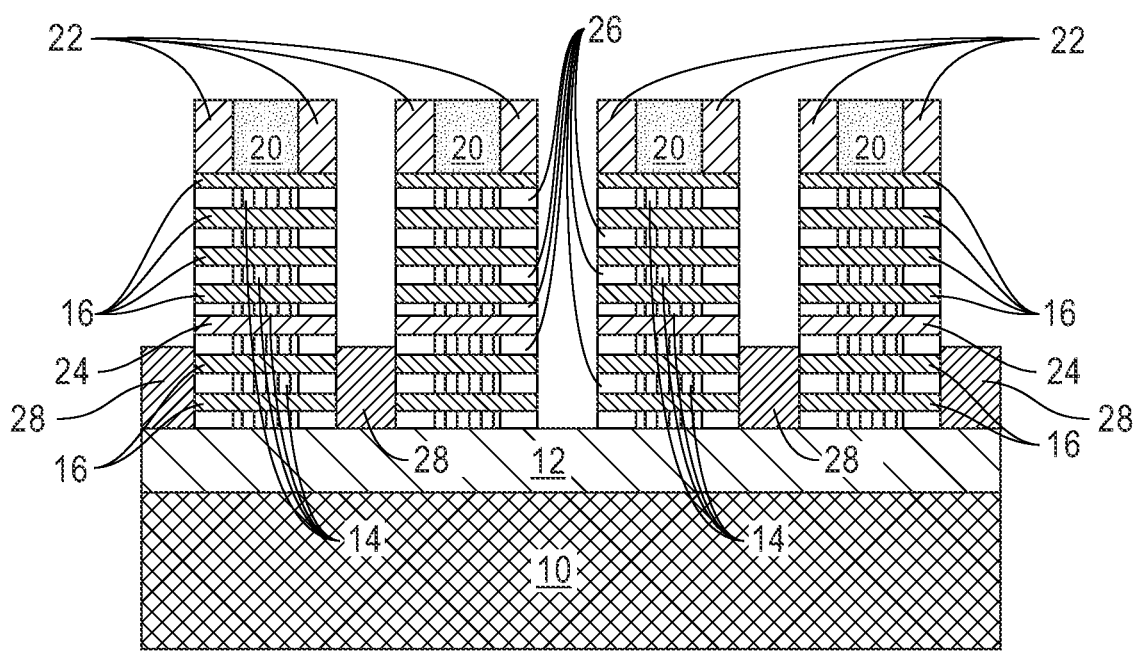

Bottom source/drain (S/D) region 28 is then formed. The bottom S/D region 28 does not extend above the topmost surface of the dielectric material nanosheet 24 as is shown in FIG. 3D, for example. Bottom S/D region 28 is of a first conductivity type (i.e., n-type or p-type) and is formed by an epitaxial growth process as defined below. The bottom S/D region 28 grows outward from the physically exposed end sidewalls of each semiconductor channel material nanosheet 16. A dopant, as defined below, is typically present during the epitaxial growth process or afterwards implant. A recess etch can be employed so as to reduce the height of the bottom S/D region 28 such that the bottom S/D region 28 is only associated with the bottom nanosheet-containing material stack, NS1. The terms "epitaxial growth" or "epitaxially growing" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

As used herein, a "source/drain or S/D" region can be a source region or a drain region depending on subsequent wiring and application of voltages during operation of the FET. The bottom S/D region 28 is composed of a semiconductor material and a dopant. The semiconductor material that provides the bottom S/D region 28 can include one of the semiconductor materials mentioned above for the semiconductor substrate 10. The semiconductor material that provides the bottom S/D region 28 can be compositionally the same, or compositionally different from, each semiconductor channel material nanosheet 16. The semiconductor material that provides the bottom S/D region 28 is however compositionally different from each recessed sacrificial semiconductor material nanosheet 14. The dopant that is present in the bottom S/D region 28 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the bottom S/D region 28 can have a dopant concentration of from $4 \times 10^{20}$ atoms/cm$^3$ to $3 \times 10^{21}$ atoms/cm$^3$. In one example, the bottom S/D region 28 is composed of phosphorus doped silicon.

Figure 4A:
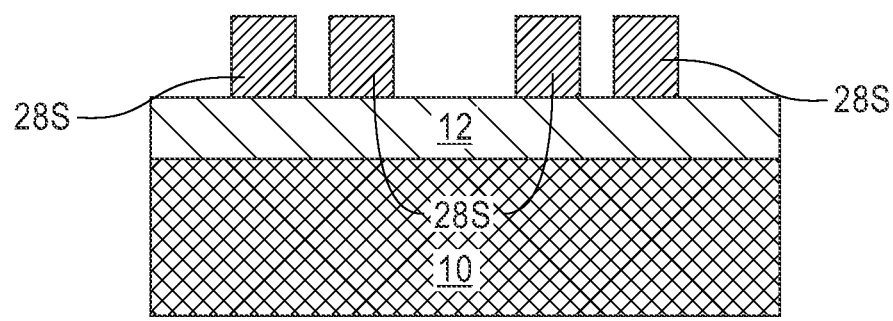
FIGS. 4A-4D are cross sectional views of the exemplary structure shown in FIGS. 3A-3D respectively, after cutting the bottom S/D region to provide spaced apart cut bottom S/D structures.
Figure 4B:
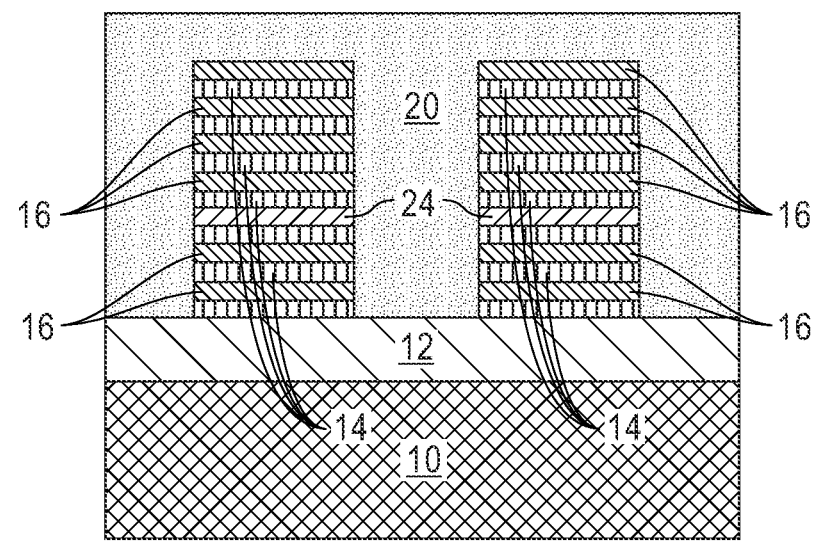
Figure 4C:
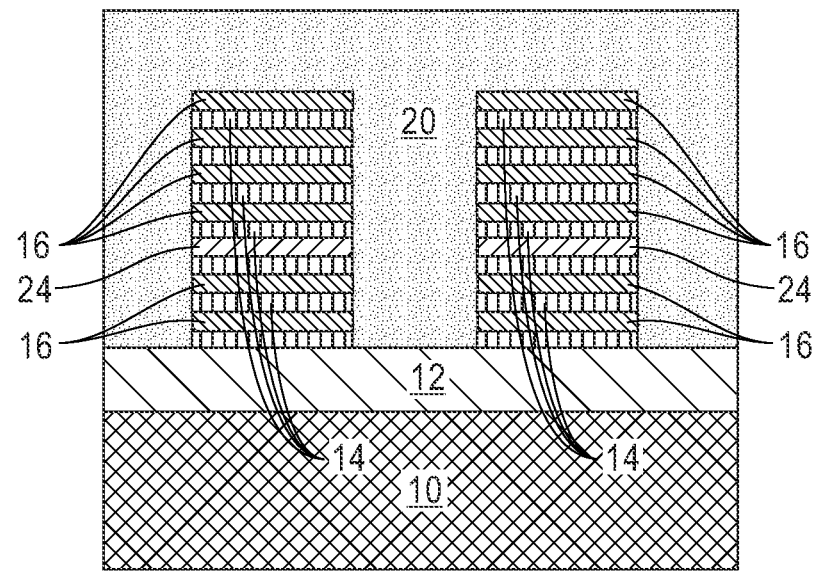
Figure 4D:
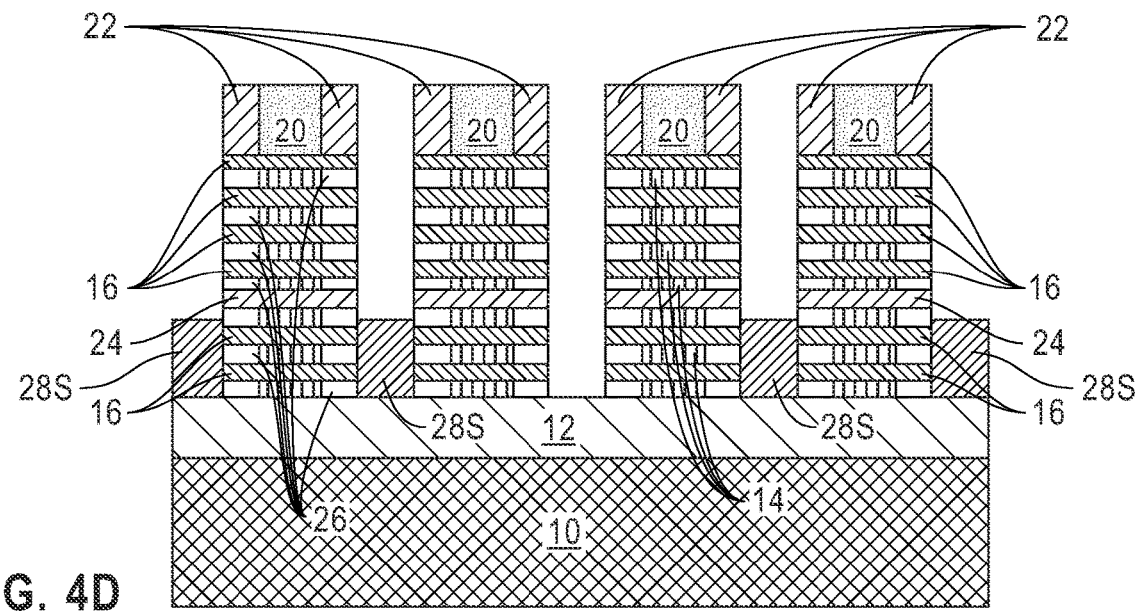
Figure 4E:
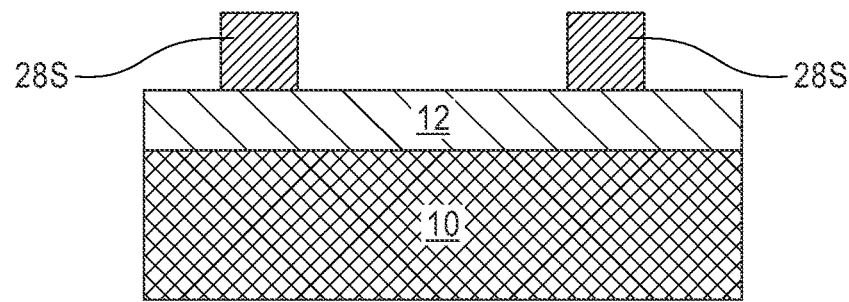
FIG. 4E is also provided which shows the structure through cut Y4-Y4 of FIG. 1.
Figure 5A:
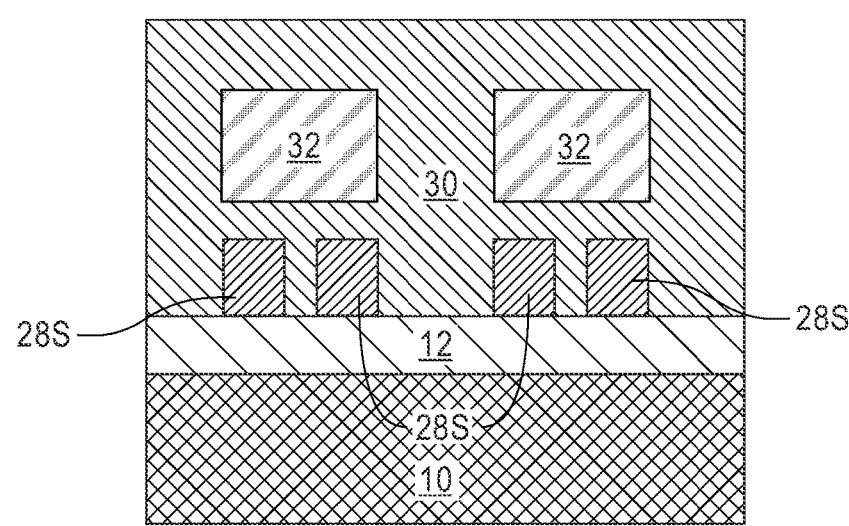
FIGS. 5A-5E are cross sectional views of the exemplary structure shown in FIGS. 4A-4E respectively, after forming a top S/D region above the spaced apart cut bottom S/D structures, and forming an interlayer dielectric (ILD) material layer.
Figure 5B:
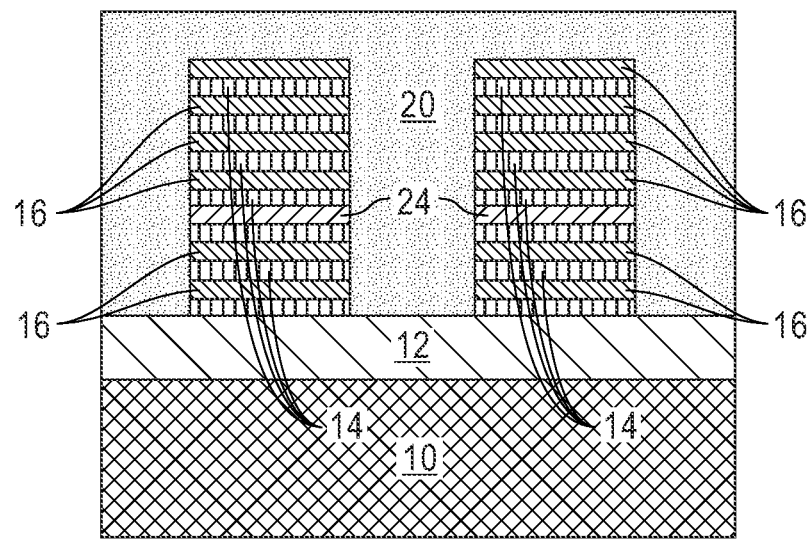
Figure 5C:
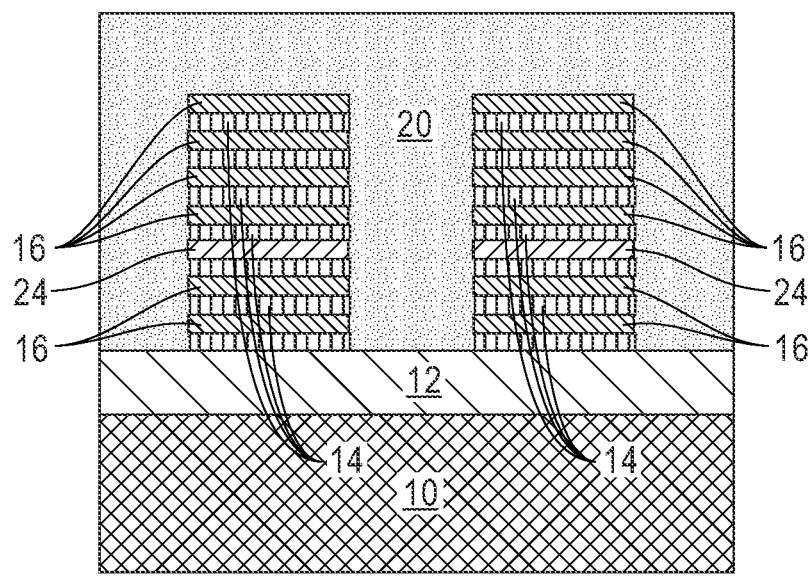
Figure 5D:
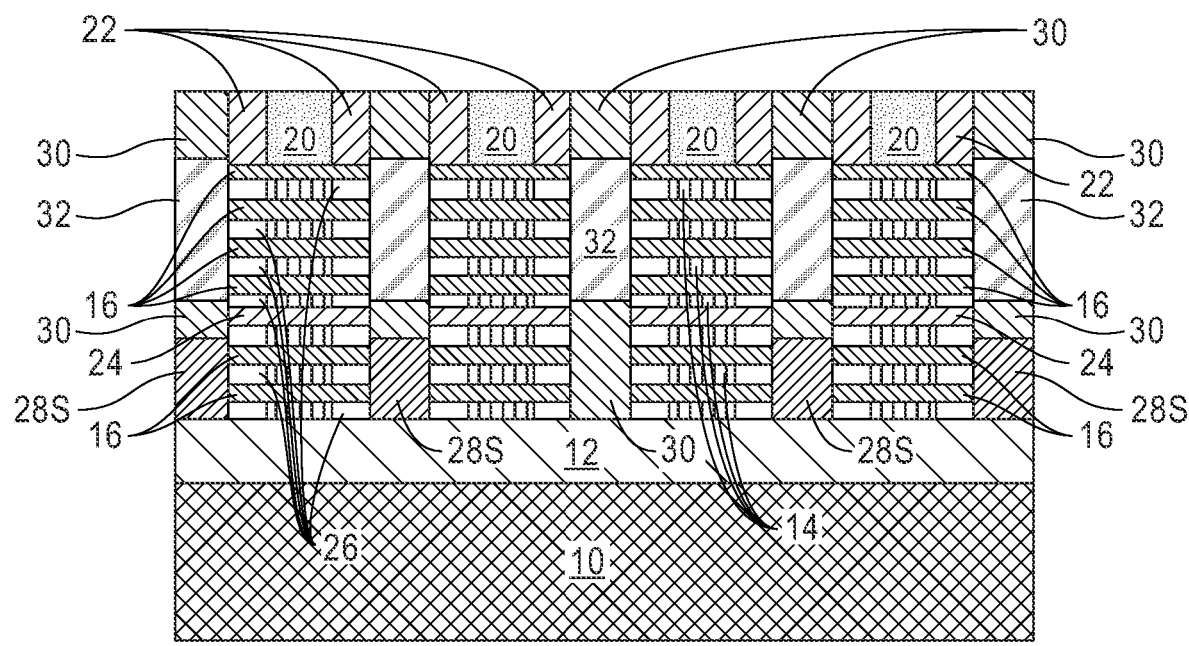
Figure 5E:
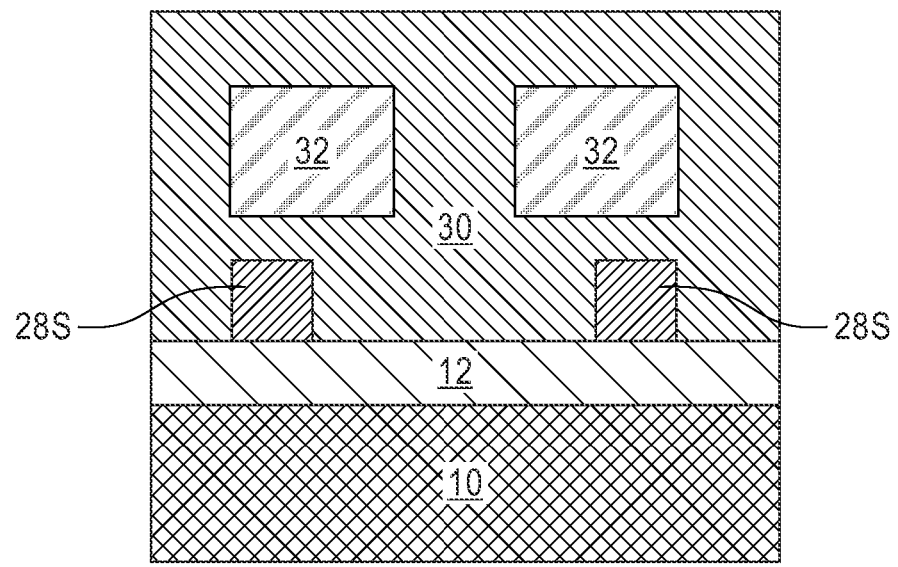

Referring now to FIGS. 4A-4D, there are illustrated the exemplary structure shown in FIGS. 3A-3D respectively, after cutting the bottom S/D region 28 to provide spaced apart cut bottom S/D structures 28S; FIG. 4E is also provided which shows the structure through Y4-Y4 shown in FIG. 1. The cutting of the bottom S/D region 28 includes lithography and etching. The etch stops on the surface of the dielectric material layer 12 as is shown, for example, in FIG. 4A. Note that in at least one area of the exemplary structure this cutting step entirely removes the bottom S/D region from between adjacent nanosheet-containing material stacks as is shown in FIG. 4E, for example.

Referring now to FIGS. 5A-5E, there are illustrated the exemplary structure shown in FIGS. 4A-4E respectively, after forming a top S/D region 32 above the spaced apart cut bottom S/D structures 28S, and forming an interlayer dielectric (ILD) material layer 30. The top S/D region 32 is of a second conductivity type (i.e., n-type or p-type) that is different from the first conductivity type mentioned above for the bottom S/D region 28. The top S/D region 32 can be formed by an epitaxial growth process as defined above for the bottom S/D region 28. A recess etch can follow the epitaxial growth of the top S/D region 32. The top S/D region 32 grows outward from the physically exposed end sidewalls of each semiconductor channel material nanosheet 16 of the top nanosheet-containing material stack, NS2.

The top S/D region 32 is composed of a semiconductor material and a dopant. The semiconductor material that provides the top S/D region 32 can include one of the semiconductor materials mentioned above for the semiconductor substrate 10; the semiconductor material that provides the top S/D region 32 can be compositionally the same as, or compositionally different from, the semiconductor material that provides the bottom S/D region 28. The semiconductor material that provides the top S/D region 32 can be compositionally the same, or compositionally different from, each semiconductor channel material nanosheet 16 of the top nanosheet-containing material stack, NS2. The semiconductor material that provides the top S/D region 32 is however compositionally different from each recessed sacrificial semiconductor material nanosheet 14. The dopant that is present in the top S/D region 32 can be either a p-type dopant or an n-type dopant as long as it provides a different conductivity than the dopant that provides the bottom S/D region 28. Note that the top S/D region 32 is not formed directly on any portion of the bottom S/D structures 28S; in the present application a lower portion of the ILD material layer 30 is formed prior to forming the top S/D regions 32.

The ILD material layer 30 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). Although not shown, the ILD material layer 30 can include a multilayered structure that includes at least two different dielectric materials stacked one atop the other such as, for example, silicon nitride and silicon dioxide. The ILD material layer 30 can be formed by a deposition process such as, for example, CVD, PECVD, or spin-on coating. A planarization process (including, for example, chemical mechanical polishing (CMP) can be performed after the deposition of the dielectric material that provides ILD material layer 30. The ILD material layer 30 typically has a topmost surface that is coplanar with a topmost surface of the sacrificial gate structure 20 and a topmost surface of the dielectric spacer 22. Note that if a sacrificial gate cap is present, the aforementioned planarization step can remove the sacrificial gate cap and reveal the sacrificial gate material of the sacrificial gate structure 20. An upper portion of the dielectric spacer 22 can also be removed by this planarization step. As is shown in the drawings, the ILD material layer 30 is located on the sidewalls and topmost surface of each bottom S/D structure 28S and is located on the sidewalls and a bottommost surface of each top S/D region 32.

Referring now to FIGS. 6A-6E, there are illustrated the exemplary structure shown in FIGS. 5A-5E respectively, after removing the sacrificial gate structure 20 and each sacrificial semiconductor material nanosheet 14 of the bottom nanosheet-containing material stack, NS1, and the top nanosheet-containing material stack, NS2, and forming a gate structure 33 wrapping around physically exposed portions of each semiconductor channel material nanosheet 16 of both the bottom and top nanosheet-containing material stacks, NS1 and NS2.

The sacrificial gate structure 20 and the surficial semiconductor material nanosheets 14 of both the first and second nanosheet-containing material stack, NS1 and NS2, are removed by utilizing a first etching process that is selective in removing the sacrificial gate structure 20 and a second etching process that is selective in removing the sacrificial semiconductor material nanosheets 14 relative to the semiconductor channel material nanosheets 16. For example, the second etch can be used to selectively remove SiGe sacrificial semiconductor material nanosheets relative to Si semiconductor channel material nanosheets. Removal of the sacrificial semiconductor material nanosheets 14 provides suspended semiconductor channel material nanosheets 16 in each of the first and second nano sheet-containing material stacks, NS1 and NS2. The removal of the sacrificial gate structure 20 and the sacrificial semiconductor material nanosheets 14 provides a gate opening above and below each suspended semiconductor channel material nanosheet 16 of the first and second nanosheet-containing material stacks, NS1 and NS2.

Figure 6A:
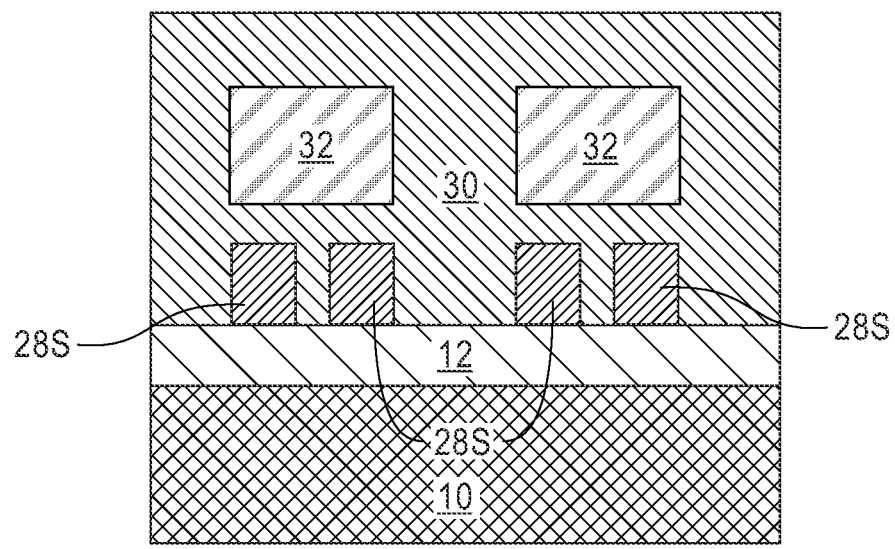
FIGS. 6A-6E are cross sectional views of the exemplary structure shown in FIGS. 5A-5E respectively, after removing the sacrificial gate structure and each sacrificial semiconductor material nanosheet of the bottom nanosheet-containing material stack and the top nanosheet-containing material stack, and forming a gate structure around physically exposed portions of each semiconductor channel material nanosheet of both the bottom and top nanosheet-containing material stacks.
Figure 6B:
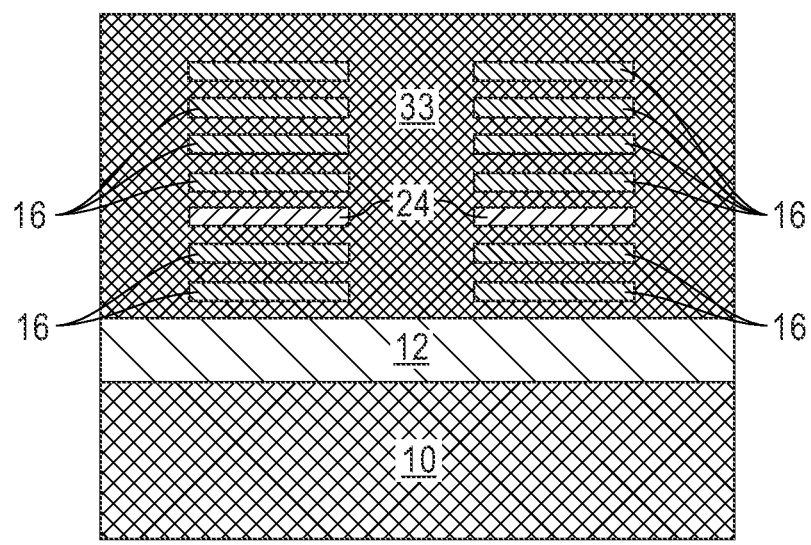
Figure 6C:
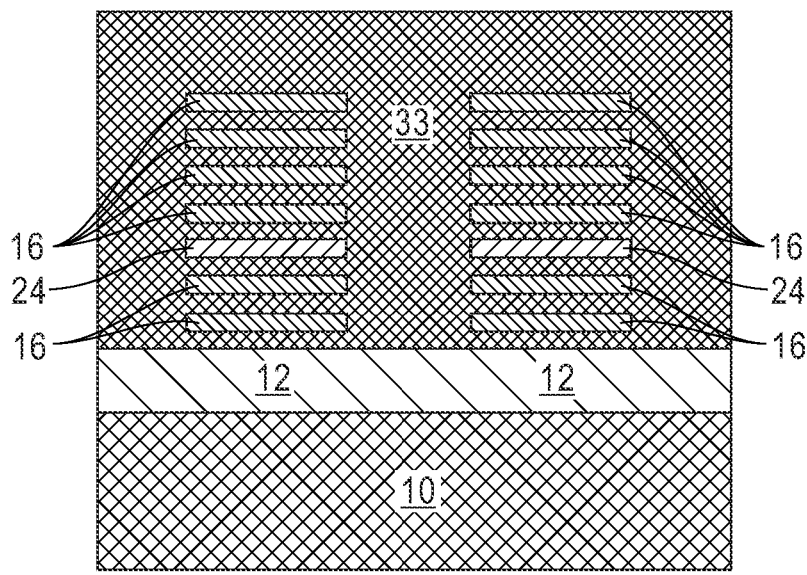
Figure 6D:
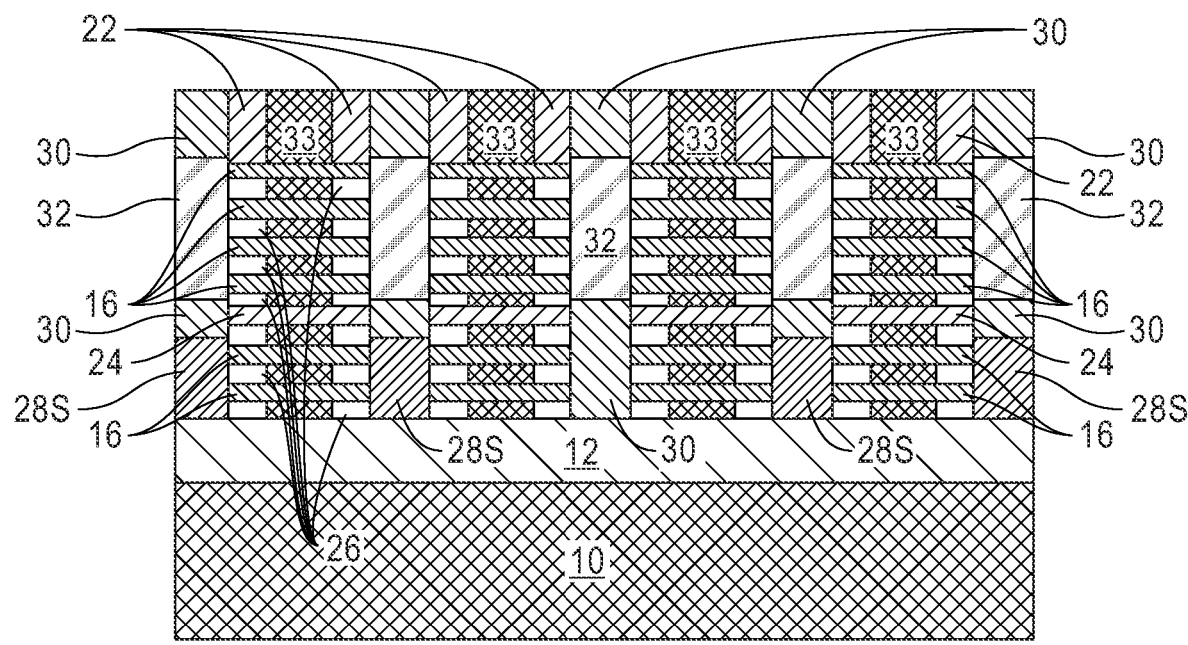
Figure 6E:
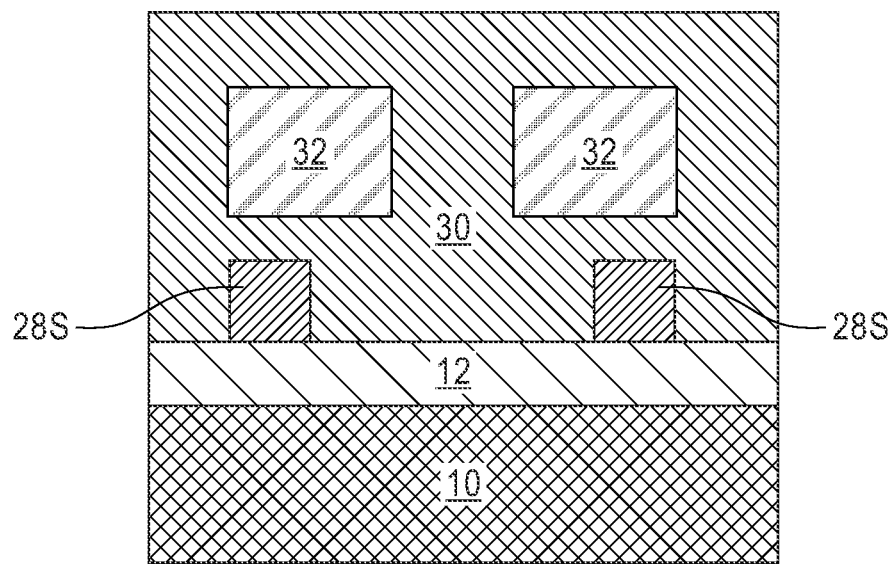

The gate structure 33 is then formed into the gate openings. The gate structure 33 includes at least a gate dielectric material layer and a gate electrode; the gate dielectric material layer and the gate electrode are not separately illustrated in the drawings of the present application. The gate structure 33 wraps around the semiconductor channel material nanosheets 16 as shown in FIGS. 6B, 6C and 6D. As is known, the gate dielectric material layer of the gate structure 33 is in direct contact with physically exposed portions of each semiconductor channel material nanosheet 16, and the gate electrode is located on the gate dielectric material layer. In some embodiments, the gate structure includes a work function metal (WFM) layer (not shown) located between the gate dielectric material layer and the gate electrode. In some embodiments, a gate cap (also not shown) can be formed atop the gate structure 33.

The forming of the gate structure 33 includes forming a continuous layer of gate dielectric material and a gate electrode material inside and the gate opening. The continuous layer of gate dielectric material can include silicon oxide, or a dielectric material having a dielectric constant greater than 4.0 (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The high-k gate dielectric material can further include dopants such as lanthanum (La), aluminum (Al) and/or magnesium (Mg). The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM (work function metal) can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, chemical mechanical polishing (CMP), is used to remove the continuous layer of the gate dielectric material, the optional layer of WFM and the gate electrode material from outside gate opening. The remaining continuous layer of the gate dielectric material that is present inside the gate opening can be referred to as gate dielectric material layer, the remaining optional layer of WFM that is present inside the gate opening can be referred to a WFM layer, and remaining gate electrode material that is present inside the gate opening provides gate electrode of the gate structure 33.

When present, gate cap can be composed of a hard mask material such as, for example, silicon dioxide or silicon nitride with or without an air gap, or the gate cap can be composed solely of an air gap. The gate cap can be formed by a deposition process, followed by a planarization process. In embodiments in which a gate cap is employed, a topmost portion of the gate structure 33 can be recessed prior to forming the gate cap. In the present application, a topmost surface of the gate structure 33 or the gate cap, if present, is coplanar with a topmost surface of ILD material layer 30.

Figure 7A:
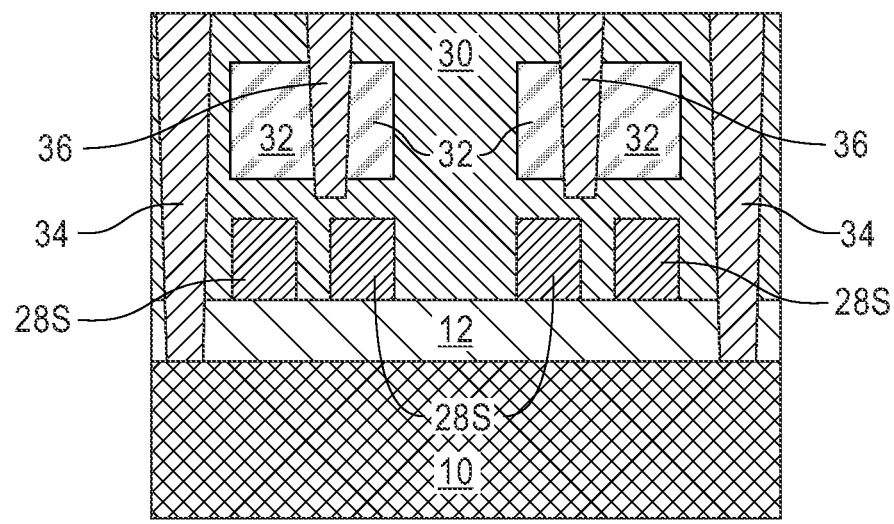
FIGS. 7A-7E are cross sectional views of the exemplary structure shown in FIGS. 6A-6E respectively, after forming a full gate cut structure and a top gate cut structure.
Figure 7B:
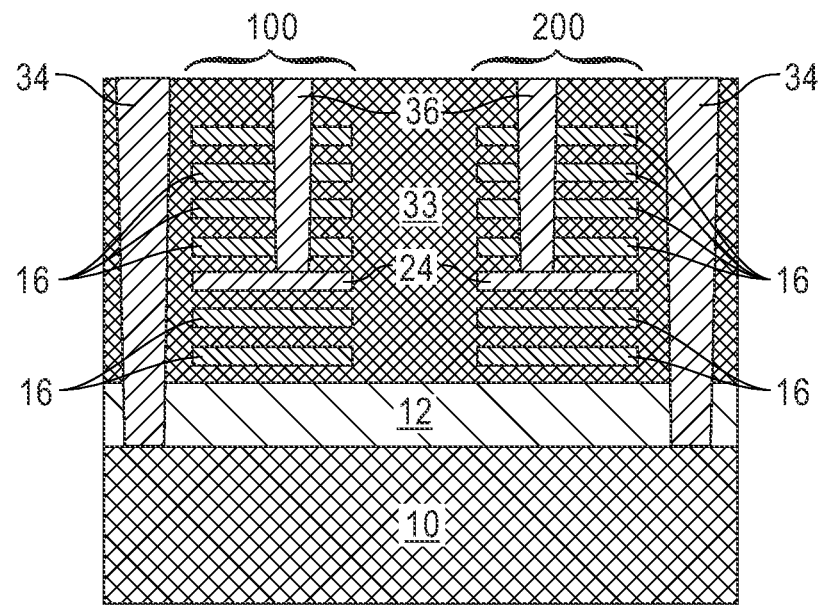
Figure 7C:
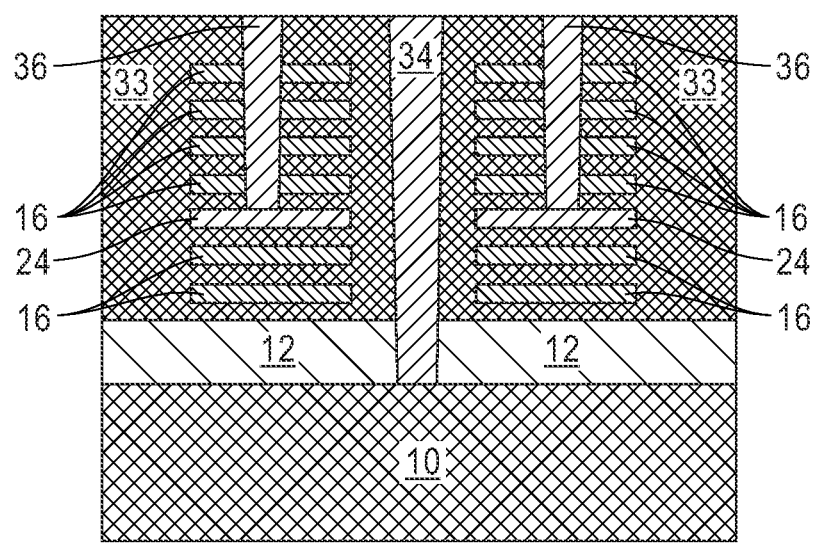
Figure 7D:
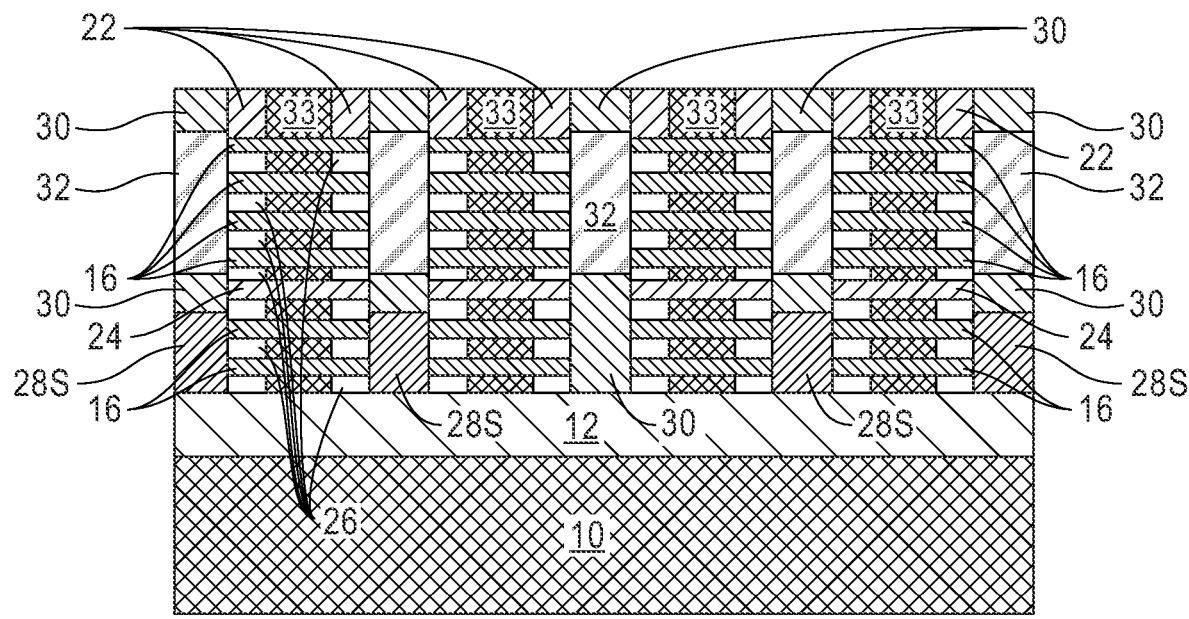
Figure 7E:
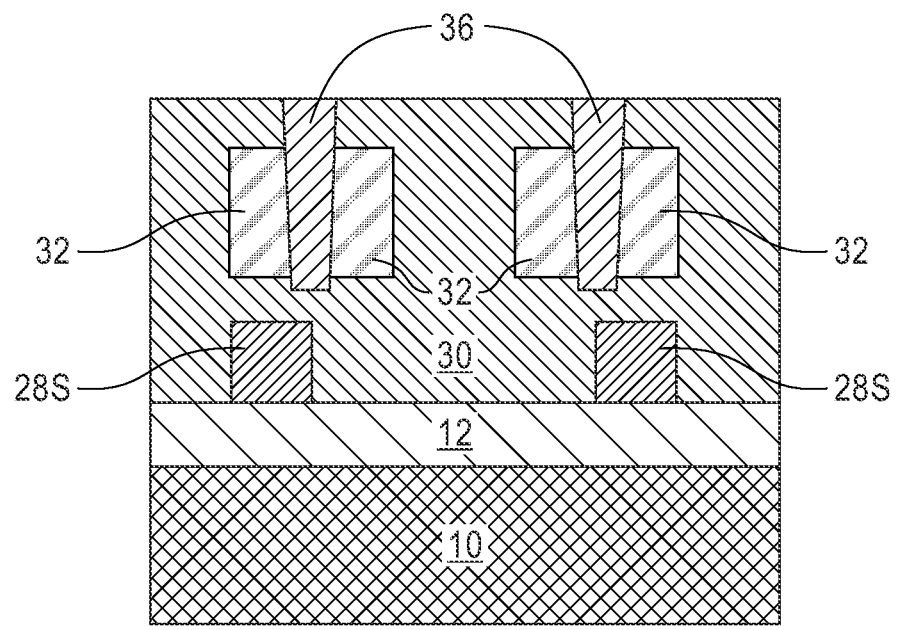
Figure 8A:
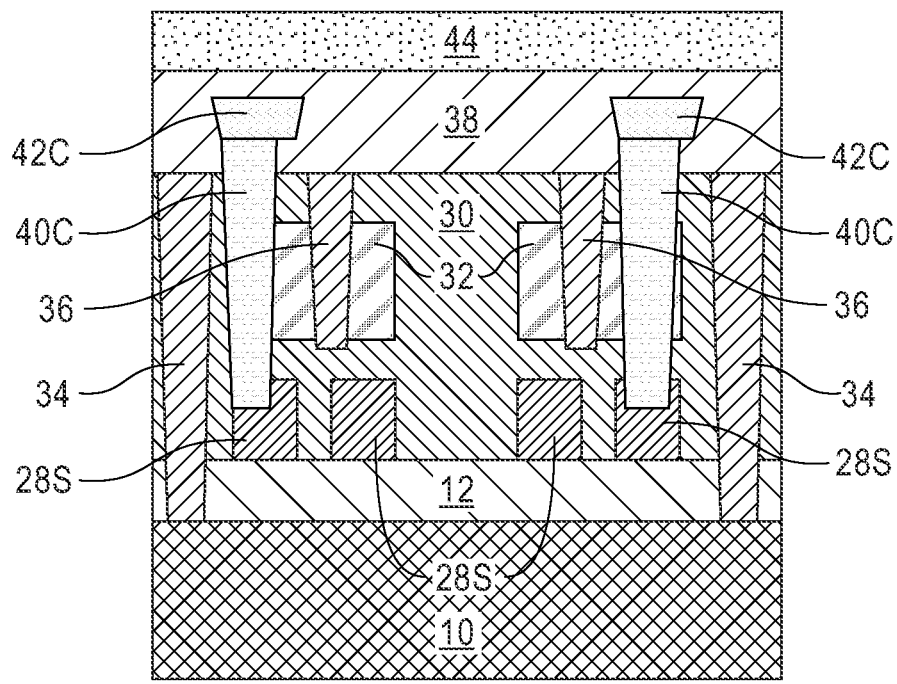
FIGS. 8A-8E are cross sectional views of the exemplary structure shown in FIGS. 7A-7E respectively, after forming frontside contact structures, a back-end-of-the-line (BEOL) structure and a carrier wafer.
Figure 8B:
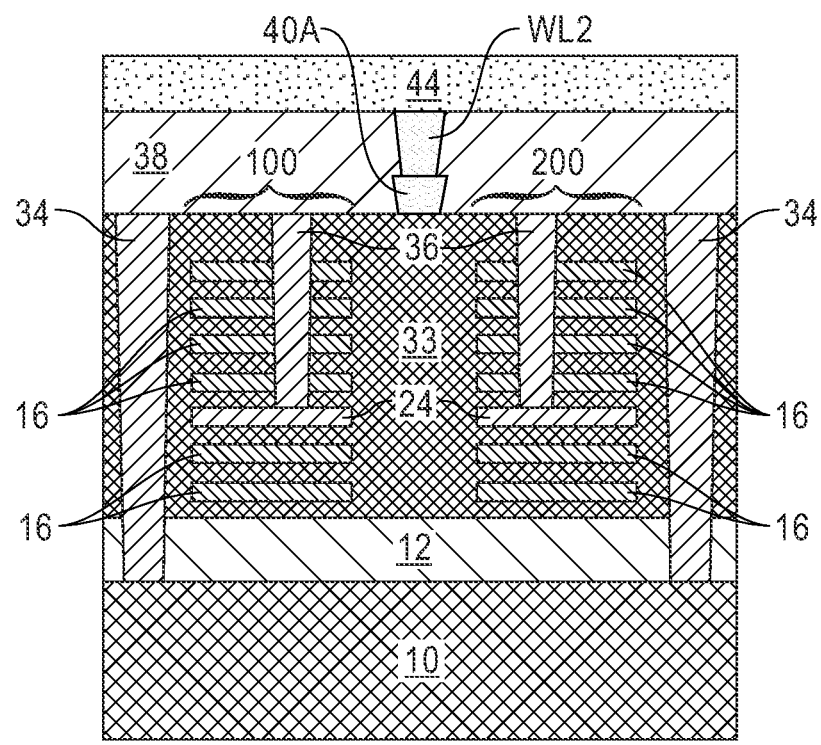
Figure 8C:
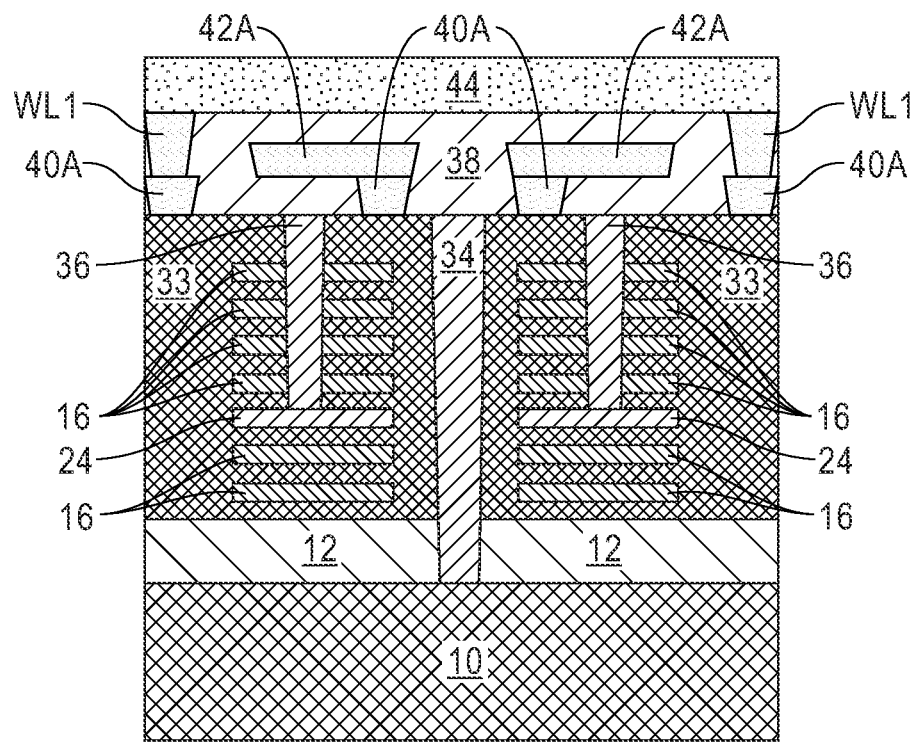
Figure 8D:
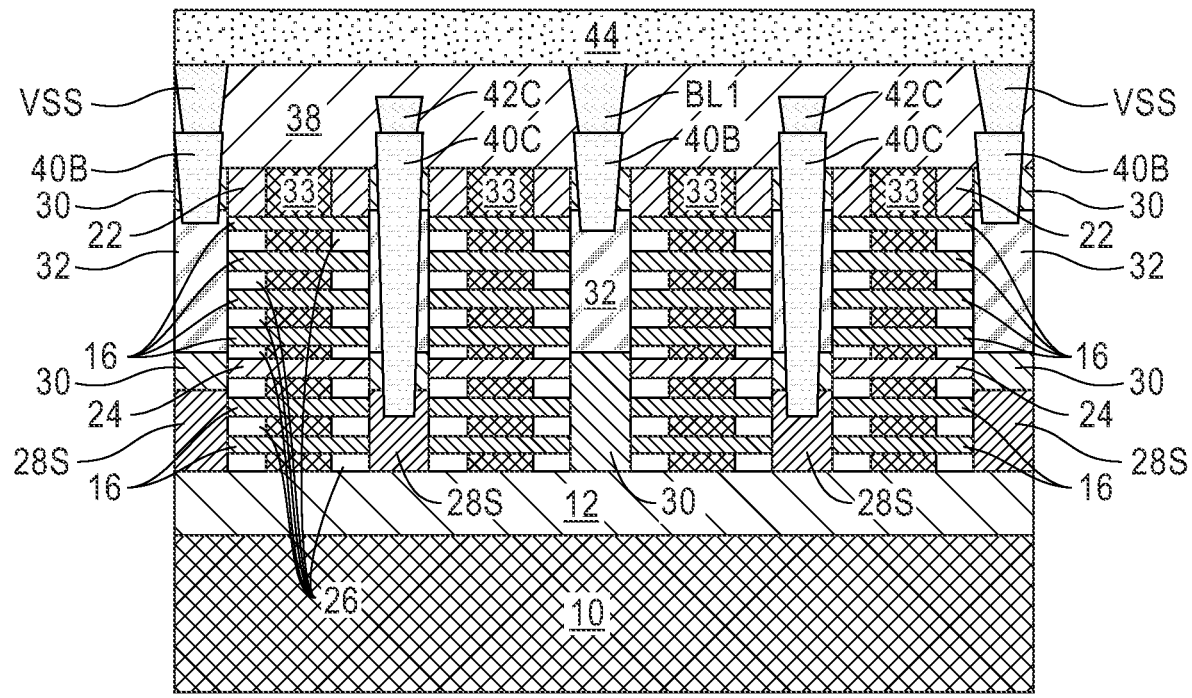
Figure 8E:
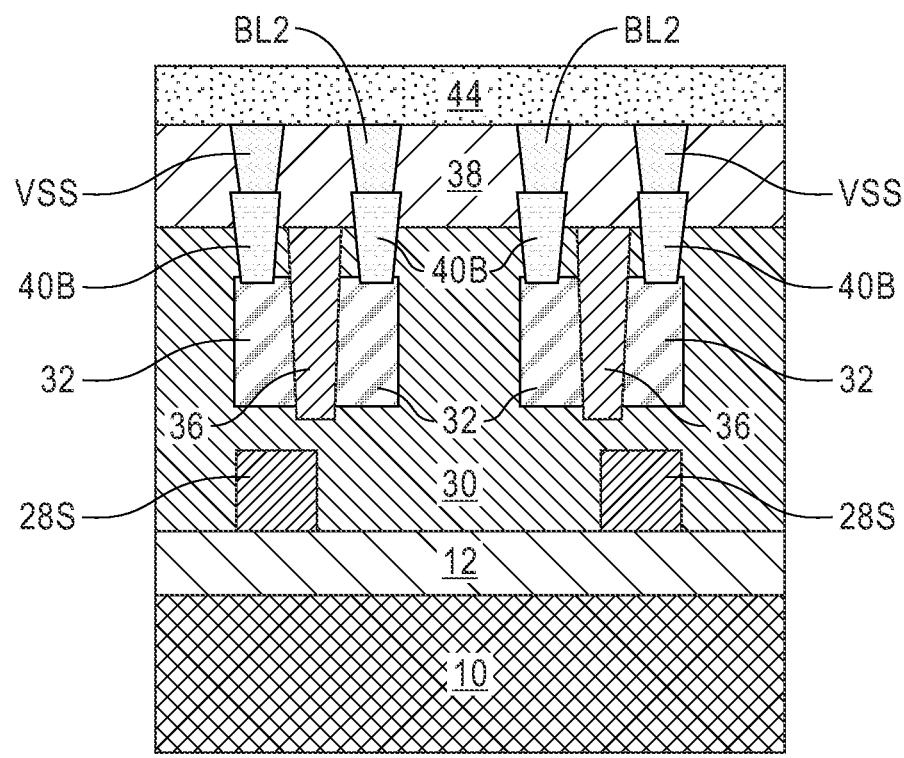
Figure 9A:
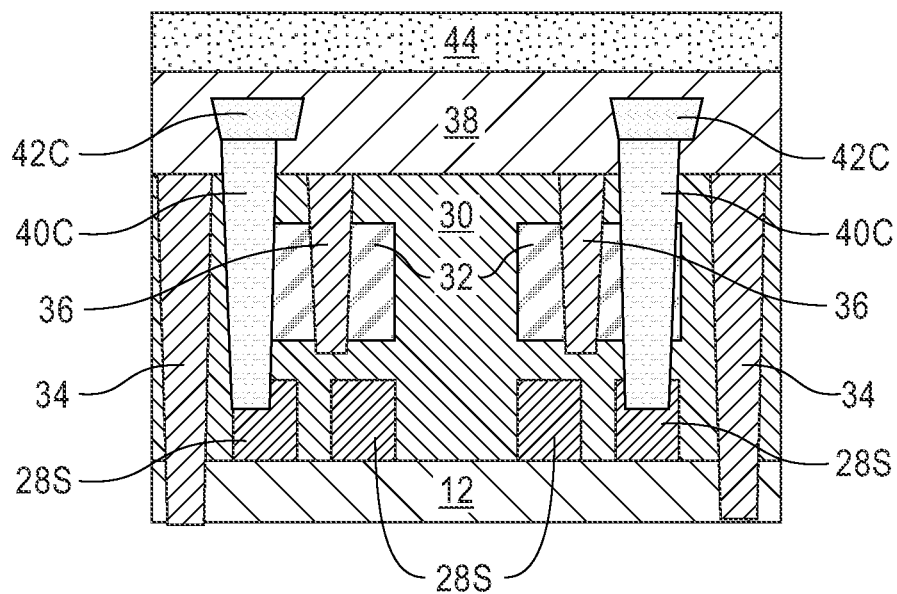
FIGS. 9A-9E are cross sectional views of the exemplary structure shown in FIGS. 8A-8E respectively, after removing the semiconductor substrate to reveal a surface of the dielectric material layer.
Figure 9B:
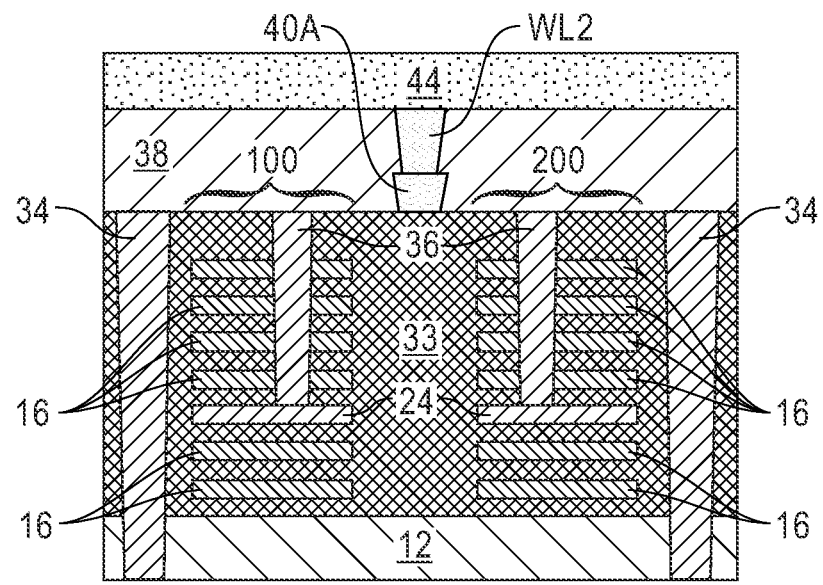
Figure 9C:
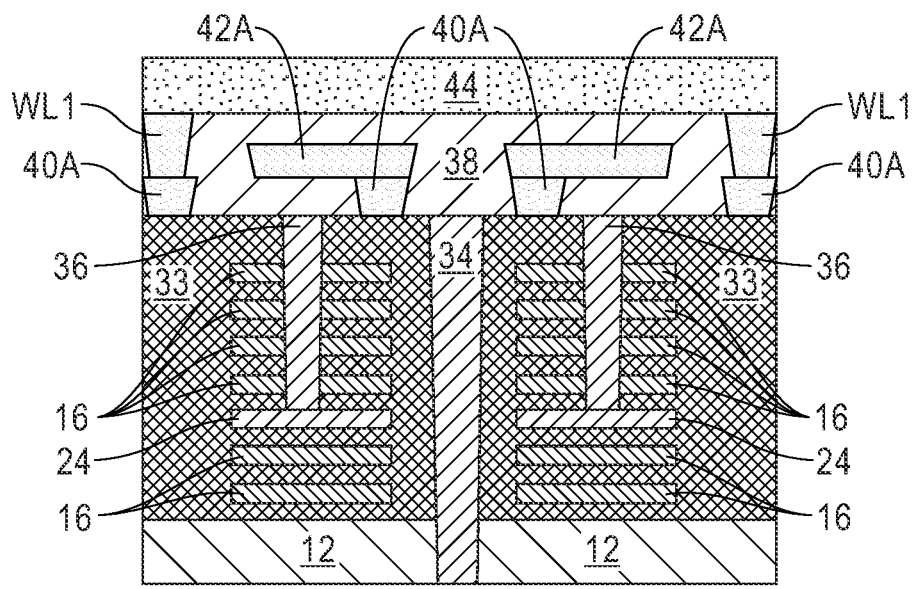
Figures 9D, 9E:
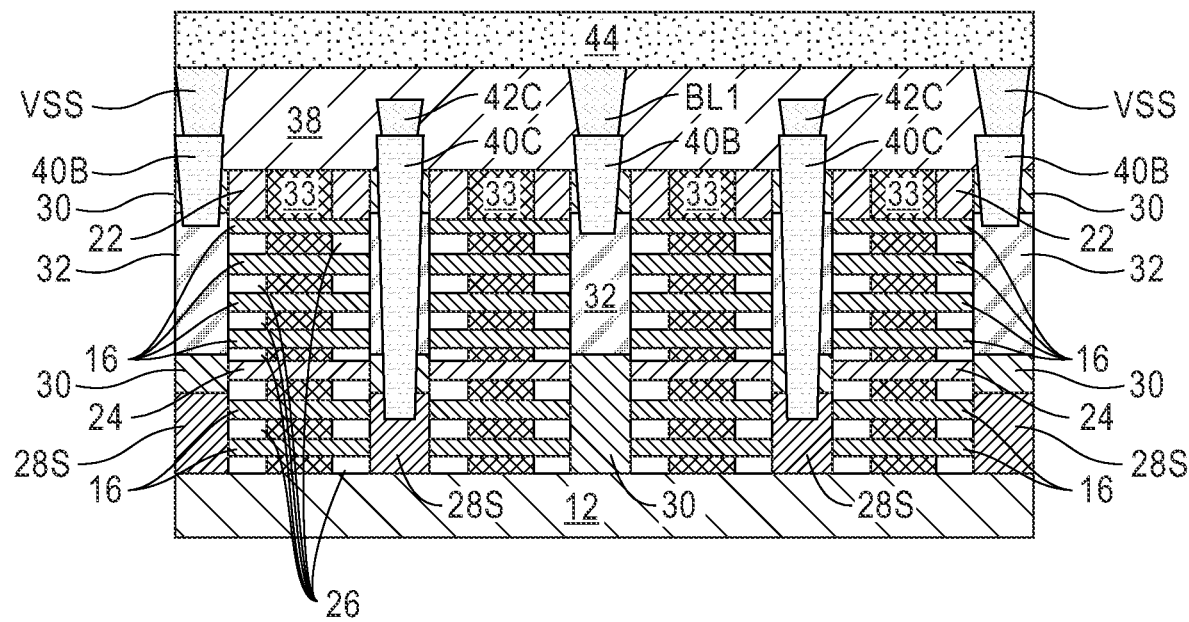

Referring now to FIGS. 7A-7E, there are illustrated the exemplary structure shown in FIGS. 6A-6E respectively, after forming a full gate cut structure 34 and a top gate cut structure 36. The full gate cut structure 34 extends from a topmost surface of the gate structure 33 to at least a topmost surface of the semiconductor substrate 10; in embodiments full gate cut structure 34 can extend into a portion of the semiconductor substrate 10. The full gate cut structure 34 passes entirely through the gate structure 33 and entirely through the dielectric material layer 12 without passing through any of the semiconductor channel materials nanosheets 14 of both the bottom and top nanosheet-containing material stacks, NS1 and NS2. The full gate structure 34 defines device regions in which the semiconductor device of the present application is located. The top gate cut structure 36 extends from a topmost surface of the gate structure 33 to at least at topmost surface of the dielectric material nanosheet 24; the top gate cut structure 36 can extend partially into the dielectric material nanosheet 24, but not entirely through the dielectric material nanosheet 24. The top gate cut structure 36 provides two top gate structures 33 for each top nanosheet-containing material stack, NS2, as is shown, for example, in FIGS. 7B and 7C. Note that FIG. 7B shows a first device region that includes a first stacked field effect transistor 100 and a second stacked field effect transistor 102.

The full gate cut structure 34 and the top gate cut structure 36 are composed of a compositionally same, or a compositionally different, dielectric material. The dielectric material that provides the full gate cut structure 34 and the top gate cut structure 36 is compositionally different from at least the dielectric material that provides the dielectric material layer 12 and the dielectric material that provides the ILD material layer 30. The full gate cut structure 34 and the top gate cut structure 36 can be formed by first defining a full gate cut trench and a top gate cut trench in the exemplary structure by lithography and etching, and then filling those trenches with a dielectric material that provides the full gate cut structure 34 and the top gate cut structure 36. The dielectric fill step includes a deposition process such as, for example, CVD, PECVD, PVD or ALD. A planarization process can follow the dielectric fill step. Note that the full gate cut structure 34 and top gate cut structure 36 are formed on a frontside of the semiconductor substrate 10; the frontside of the semiconductor substrate 10 is the same of the substrate 10 that contains the gate structures 33. Thus, the top gate cut structure 36 can be referred to as a frontside top gate cut structure. The top gate cut structure 36 divides the top device into two separated devices.

Referring now to FIGS. 8A-8E, there are illustrated the exemplary structure shown in FIGS. 7A-7E respectively, after forming frontside contact structures, a back-end-of-the-line (BEOL) structure and bonding a carrier wafer. In the drawings, the BEOL structure and the carrier wafer are combined into a single layered-structure which can be referred to as a BEOL/carrier wafer structure 44. In the present application, the BEOL structure represents multiple BEOL layers/carrier wafer structure 44 that makes physically contact with a MOL dielectric material layer 38 that contacts the frontside contact structures, while the carrier wafer represent an upper portion of the BEOL/carrier wafer structure 44.

The MOL dielectric material layer 38 includes one of the dielectric materials mentioned above for ILD material layer 30. The MOL dielectric material layer 38 can be formed utilizing one of the deposition processes mentioned above for forming the ILD material layer 30. In the present application, the dielectric material layer 38 is typically formed in two or more deposition processes in which a bottom portion of the MOL dielectric material layer 38 is formed, then at least some of the frontside contact structures (typically the frontside S/D contact structures) are formed, then an upper portion of the MOL dielectric material layer 38 is formed and then other frontside contact structures (typically the frontside gate contact structures) are formed.

The frontside contact structures include a frontside shared S/D contact structure 40C that contacts the top S/D region 32 and one of the bottom S/D structures 28S of the top and bottom transistors that share a shared gate structure 33, a frontside gate contact structure 40A that contacts a topmost portion of the gate structure 33, and a frontside top S/D contact structure 40B that contacts one of the top S/D regions 32. Each of the frontside contact structures 40A, 40B and 40C can include a compositionally same, or different, contact conductor material. The contact conductor material can include a conductive metal, such as W, Cu, Al, Co, Ru, Mo, Os, Ir, Rh or an alloy thereof. In embodiments, the frontside contact structures can include a silicide liner such as TiSi, NiSi, NiPtSi, etc., and an adhesion metal liner, such as TiN. The contact conductor material can be formed by any suitable deposition method such as, for example, ALD, CVD, PVD or plating. The frontside contact structures can be formed by forming trenches within the exemplary structure, filling those trenches with a contact conductor material, and then planarization to remove any contact conductor material that is located outside the trenches.

In some embodiments (not shown), a metal semiconductor alloy region can be formed in each of the trenches that physically exposed the bottom S/D structure 28 and/or the top S/D region 32. The metal semiconductor alloy region can be composed of a silicide or germicide. In one or more embodiments of the present application, the metal semiconductor alloy region can be formed by first depositing a metal layer (not shown) in the trenches that physically expose the bottom S/D structure 28 and/or the top S/D region 32. The metal layer can include a metal such as Ni, Co, Pt, W, Ti, Ta, a rare earth metal (e.g., Er, Yt, La), an alloy thereof, or any combination thereof. The metal layer can be deposited by ALD, CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the bottom S/D structure 28S or top S/D region 32 to provide the metal semiconductor alloy region. The unreacted portion of the metal layer, and, if present, the diffusion barrier, are then removed, for example, by an etch process (or a plurality of etching processes). In one embodiment, the etching process can be a wet etch that removes the metal in the metal layer selective to the metal semiconductor alloy in the metal semiconductor alloy regions.

Each of the frontside contact structures mentioned above can include one or more source/drain contact liners (not shown) formed along sidewalls of trenches prior to forming the frontside contact structures. In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed.

In accordance with the present application, conductive structures are formed atop each of the frontside contact structures. The conductive structures include a first word line, WL1, located atop some of a first frontside gate contact structure 40A, a second word line, WL2, located a second frontside gate contact structure 40A, a first bit line, BL1 located atop a first frontside top S/D contact structure 40B, a second bit line, BL2, located atop a second frontside top S/D contact structures 40B, a power source, VSS, located atop one of the frontside top S/D contact structures 40B, a frontside shared S/D cross couple structure 42C located atop some of the frontside shared S/D contact structures 40C, and a top gate cross couple structure 42A located atop some of the frontside gate contact structures 40A.

Each of the conductive structures mentioned above and as shown in FIGS. 8A-8E include one of the contact conductor materials mentioned above for the frontside contact structures. A diffusion barrier liner (not shown) can be formed along the sidewalls and bottom wall of each of the conductive structures mentioned above. Each of the conductive structure mentioned above and as shown in FIGS. 8A-8E can be formed utilizing the same technique as mentioned above for forming the frontside contact structures.

The frontside contact structures include at least one frontside shared S/D contact structure 40C that contacts the top S/D region 32 and one of the bottom S/D structures 28S of the stacked field effect transistors (e.g., 100) that share a shared gate structure, at least one frontside gate contact structure 40A that contacts a topmost portion of the gate structure 33, and at least one frontside top S/D contact structure 40B that contacts one of the top S/D regions 32.

The BEOL structure that forms a part of the BEOL/carrier wafer structure 44 includes one or more interconnect dielectric material layers that contact one or more wiring regions embedded thereon. The BEOL structure can be formed utilizing BEOL processing techniques that are well known to those skilled in the art.

The carrier wafer that forms a part of the BEOL/carrier wafer structure 44 can include one of the semiconductor materials mentioned above for semiconductor substrate 10. In the present application, the carrier wafer is typically bonded to the BEOL structure after the BEOL structure has been formed on the MOL dielectric material layer 38.

Referring now to FIGS. 9A-9E, there are illustrated the exemplary structure shown in FIGS. 8A-8E respectively, after wafer flipping and removing the semiconductor substrate 10 to reveal a surface of the dielectric material layer 12. The removal of the semiconductor substrate typically includes a material removal process such as, for example, CMP or grinding.

Figure 10A:
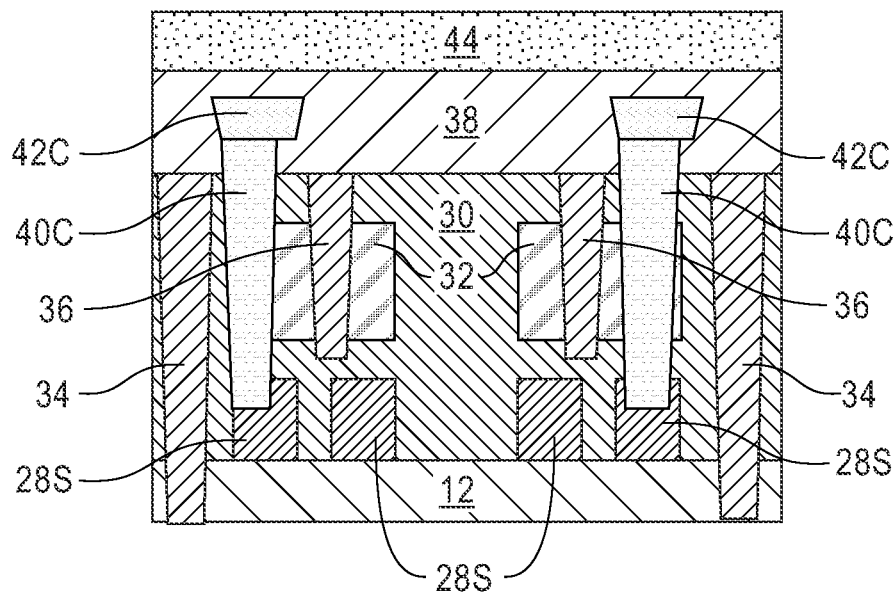
FIGS. 10A-10E are cross sectional views of the exemplary structure shown in FIGS. 9A-9E respectively, after forming a backside gate cut structure.
Figure 10B:
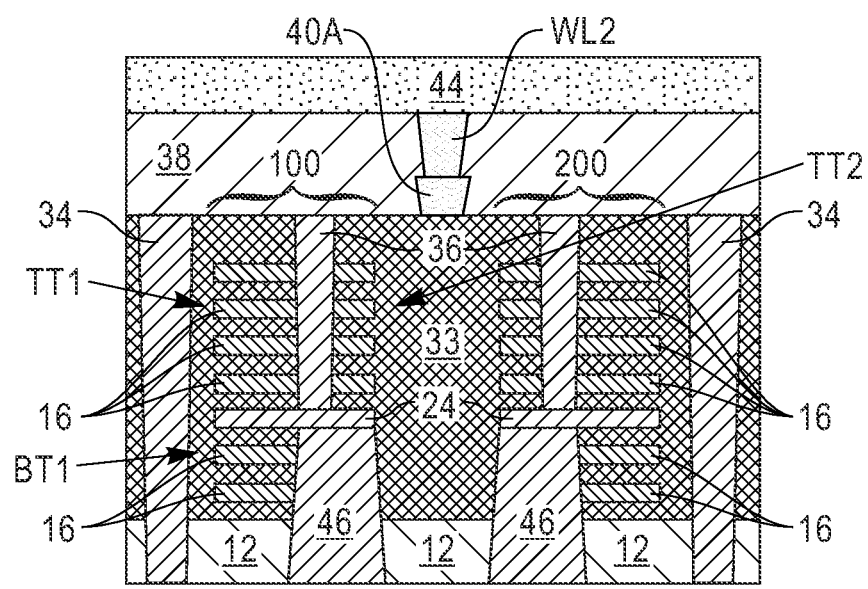
Figure 10C:
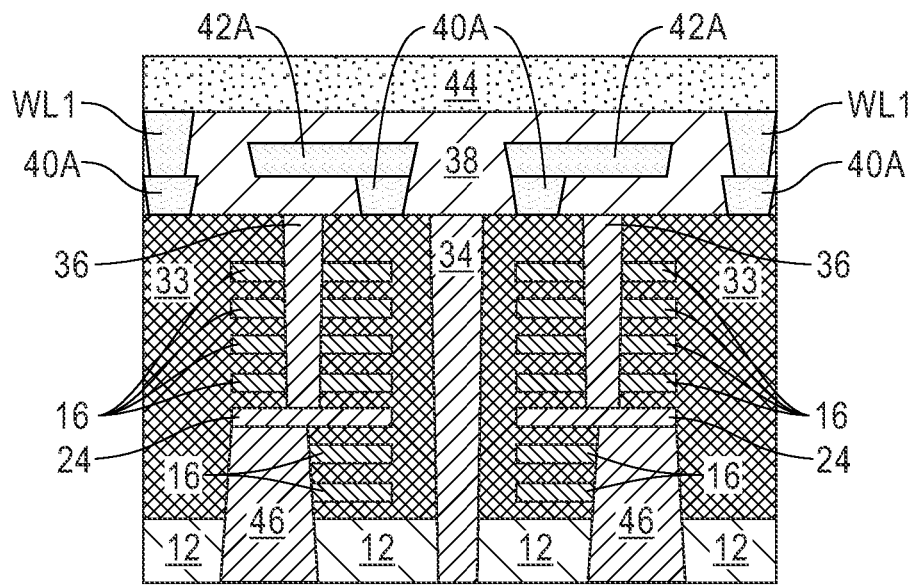
Figure 10D:
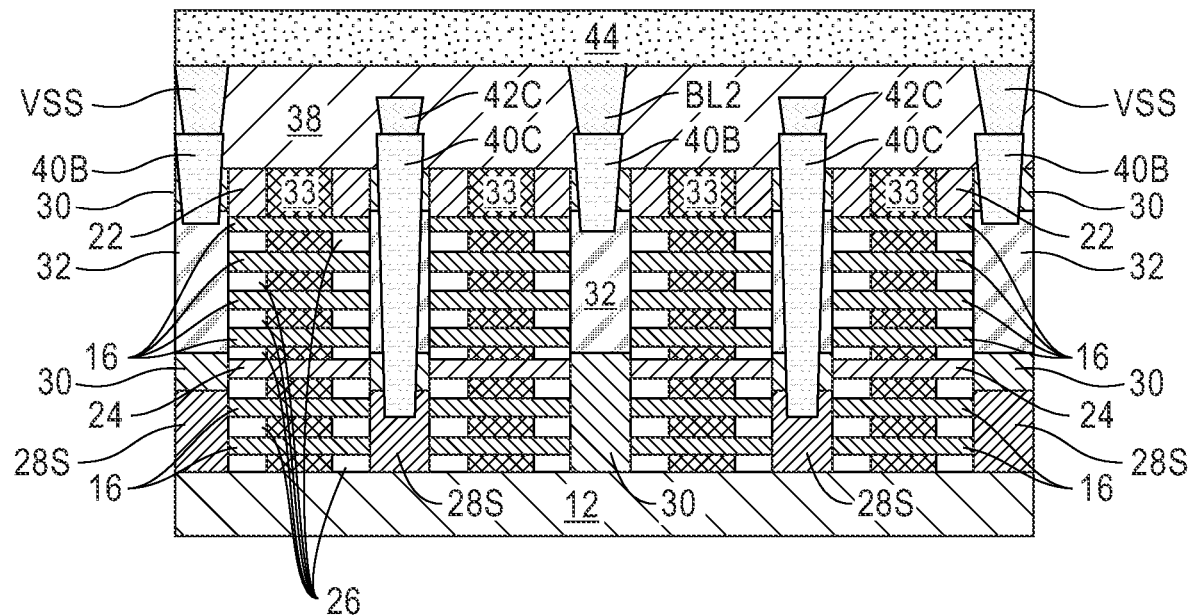
Figure 10E:
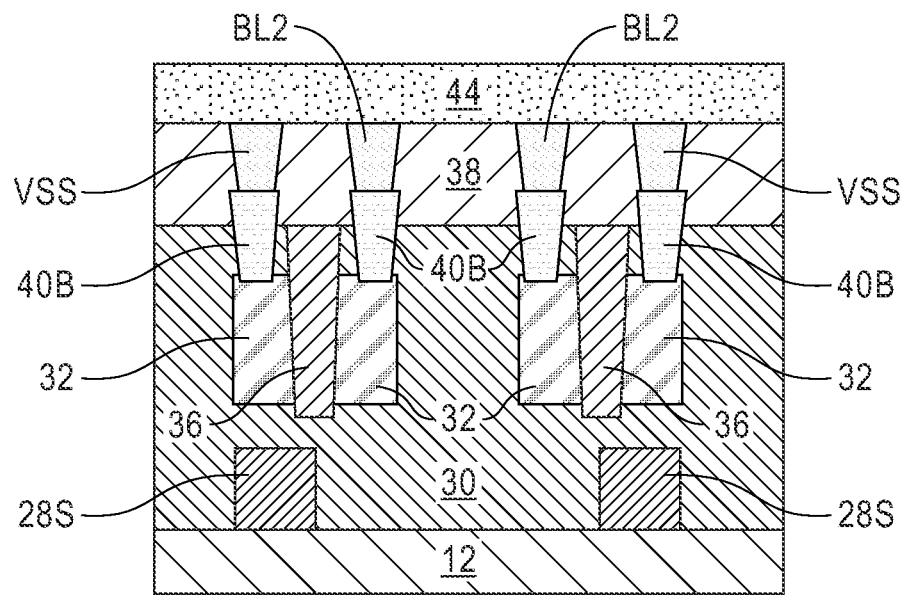
Figure 11A:
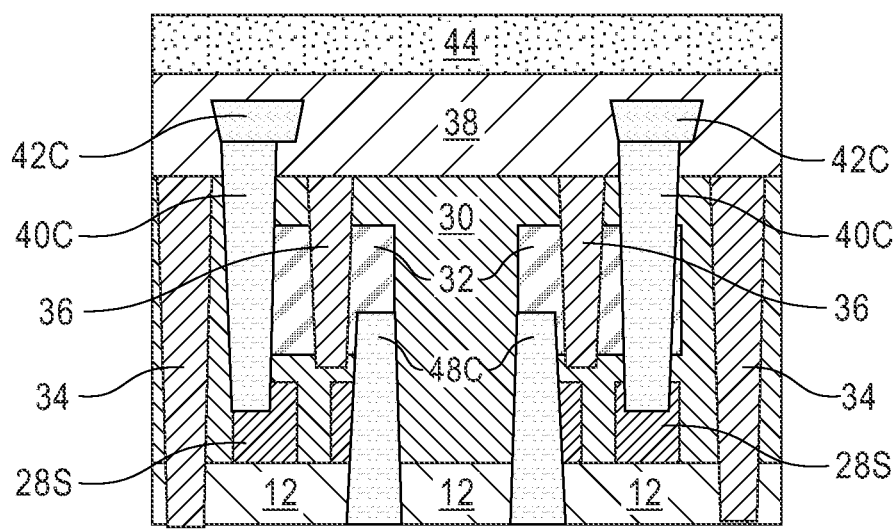
FIGS. 11A-11E are cross sectional views of the exemplary structure shown in FIGS. 10A-10E respectively, after forming backside contact structures.
Figure 11B:
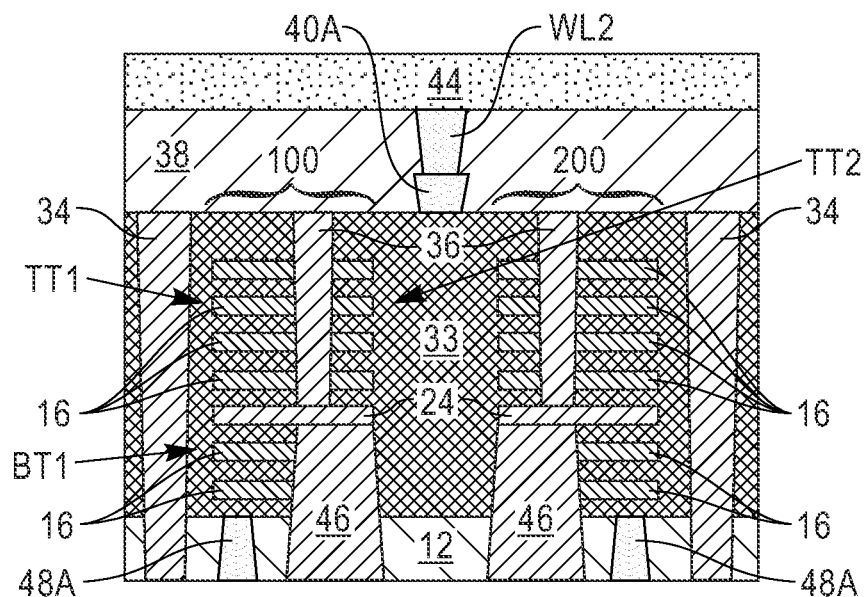
Figure 11C:
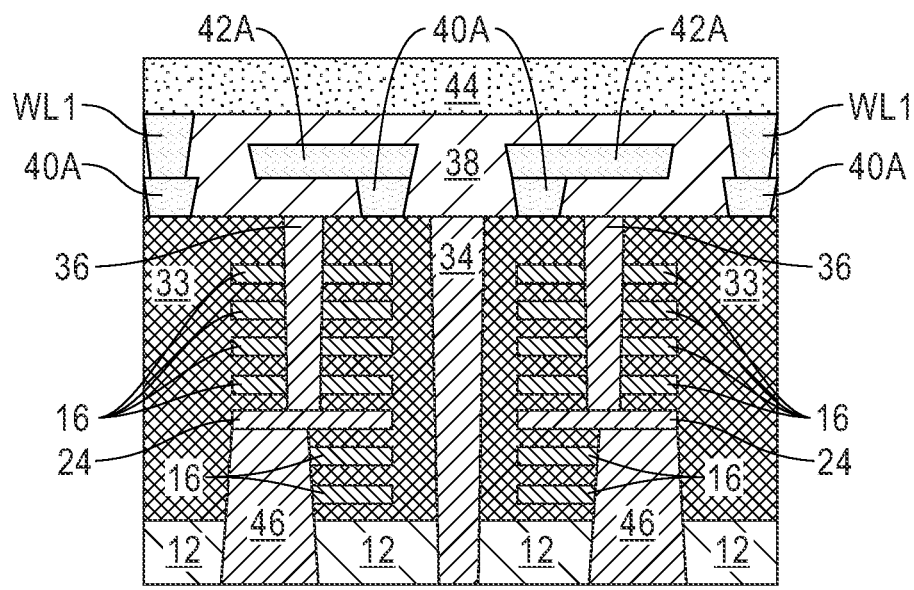
Figure 11D:
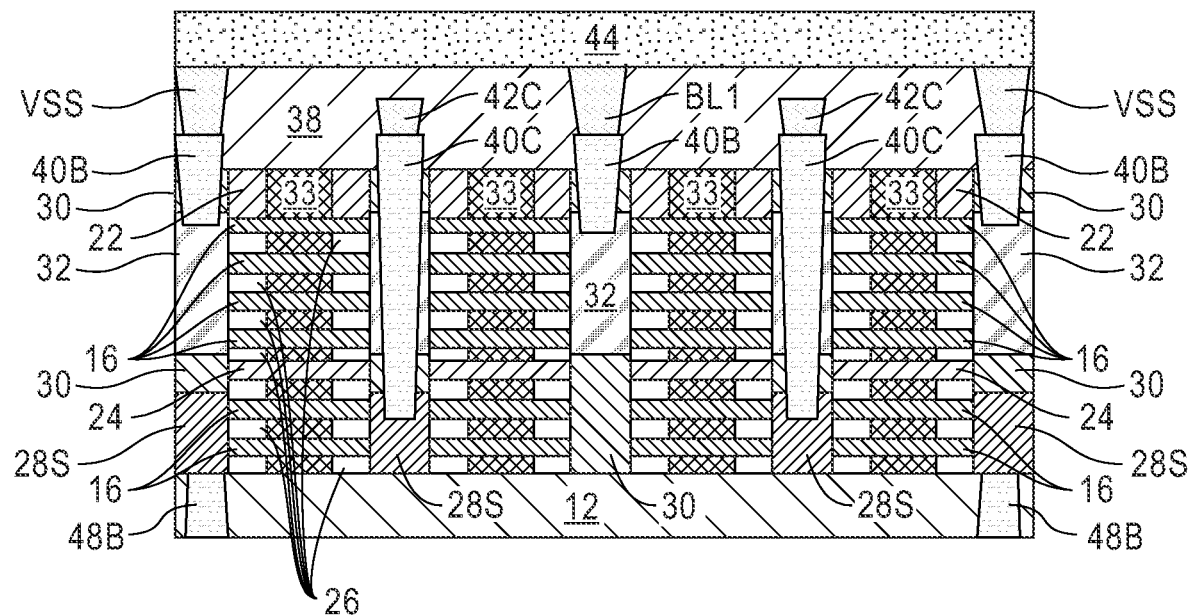
Figure 11E:
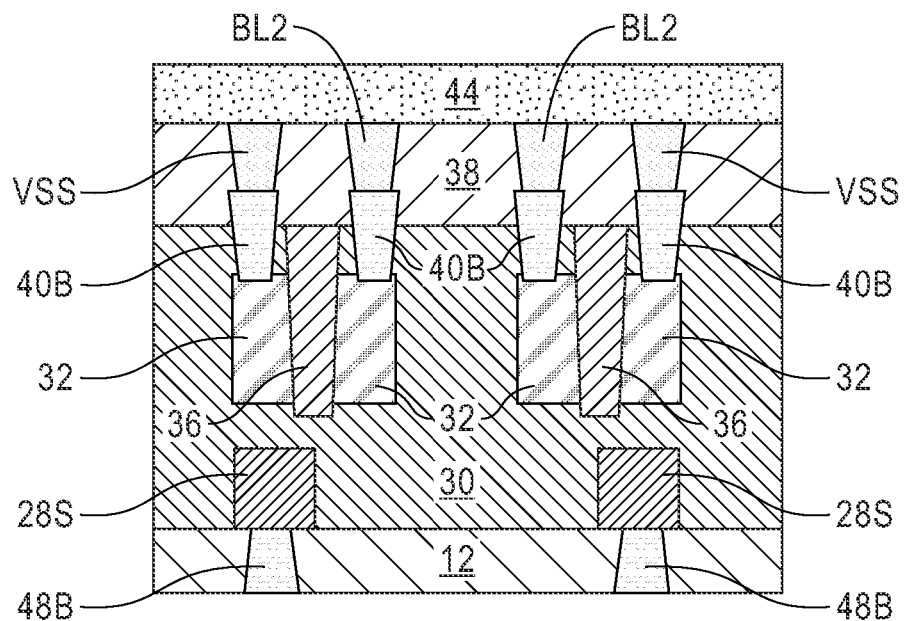
Figure 12A:
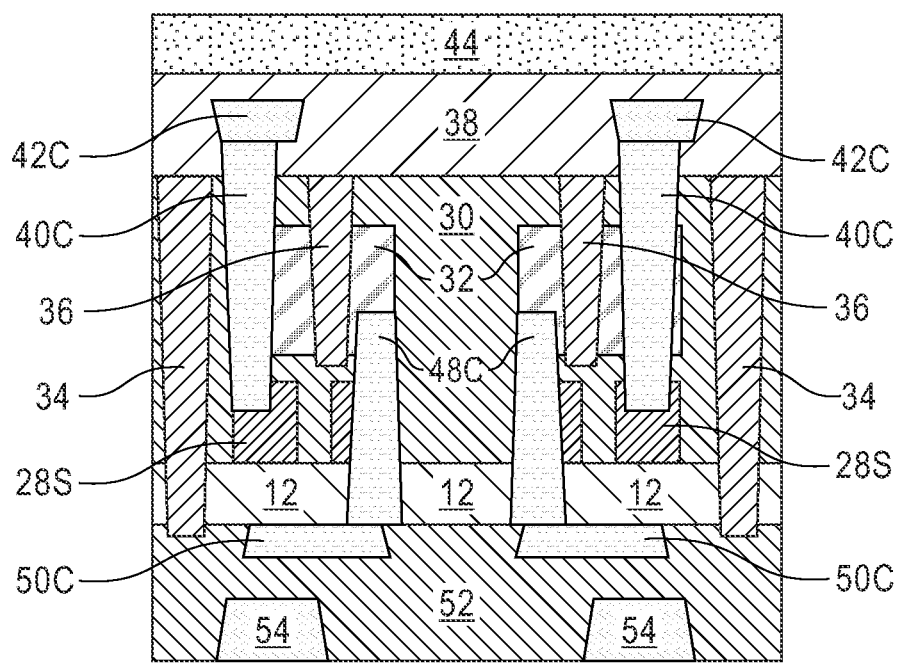
FIGS. 12A-12E are cross sectional views of the exemplary structure shown in FIGS. 11A-11E respectively, after forming a backside cross couple structure, a buried power rail and an interconnect dielectric material layer.
Figure 12B:
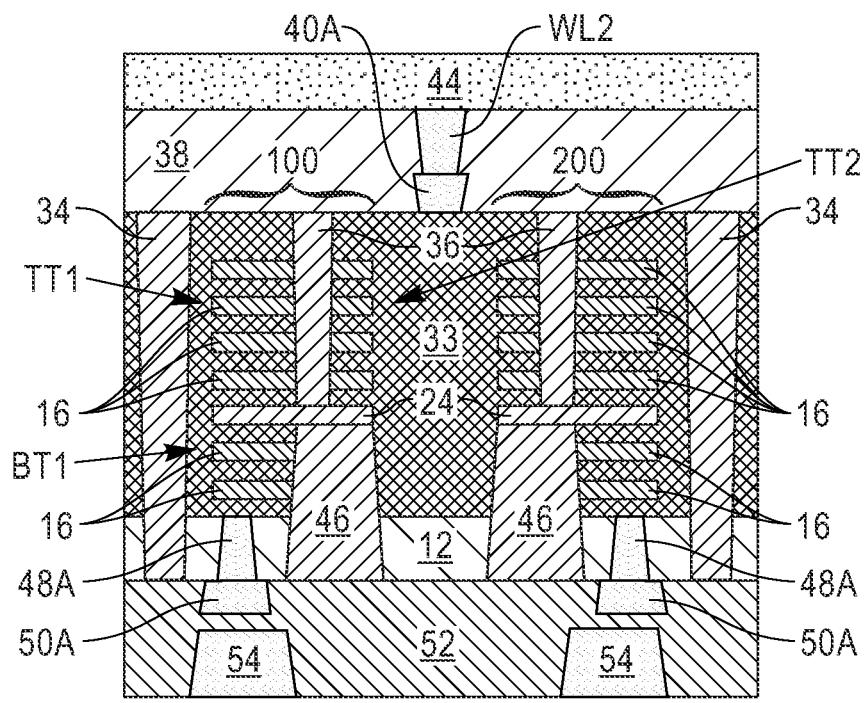
Figure 12C:
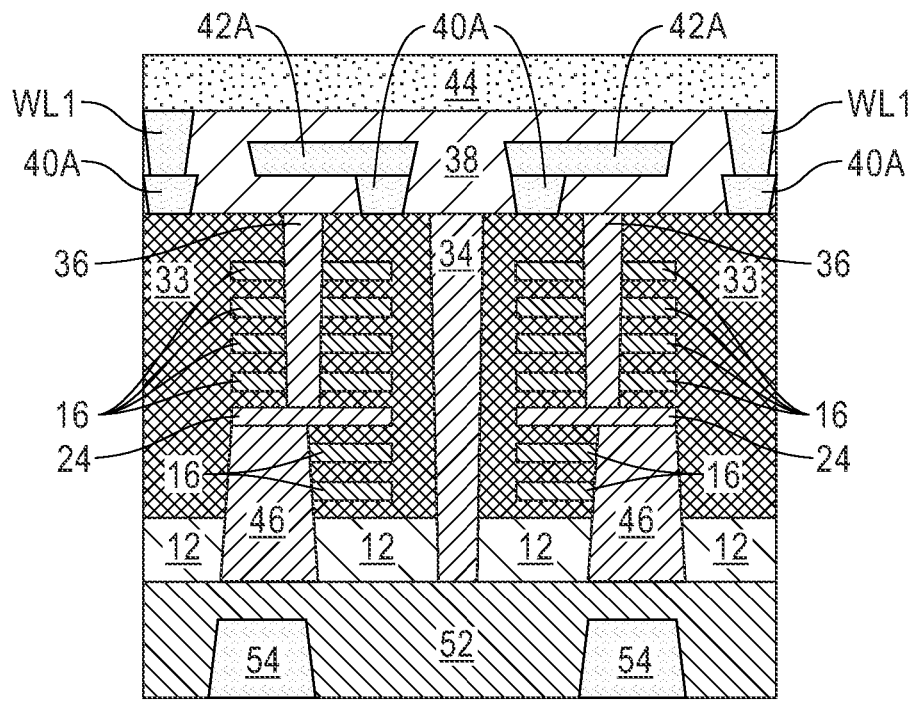
Figure 12D:
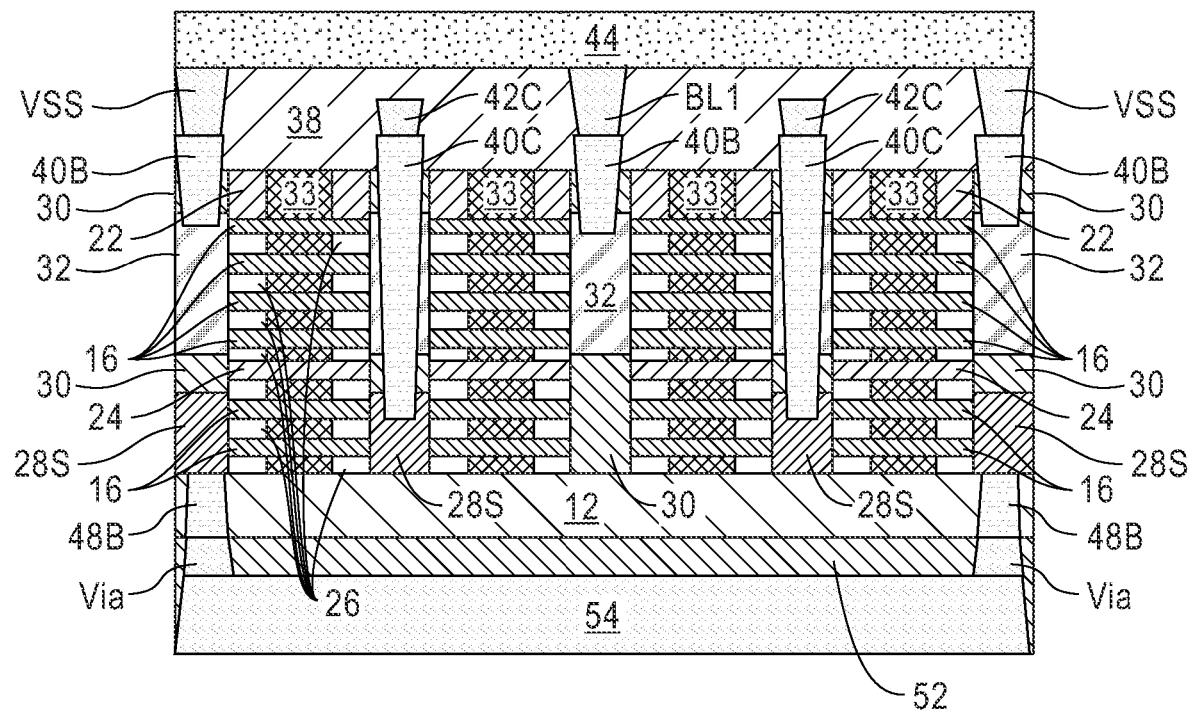
Figure 12E:
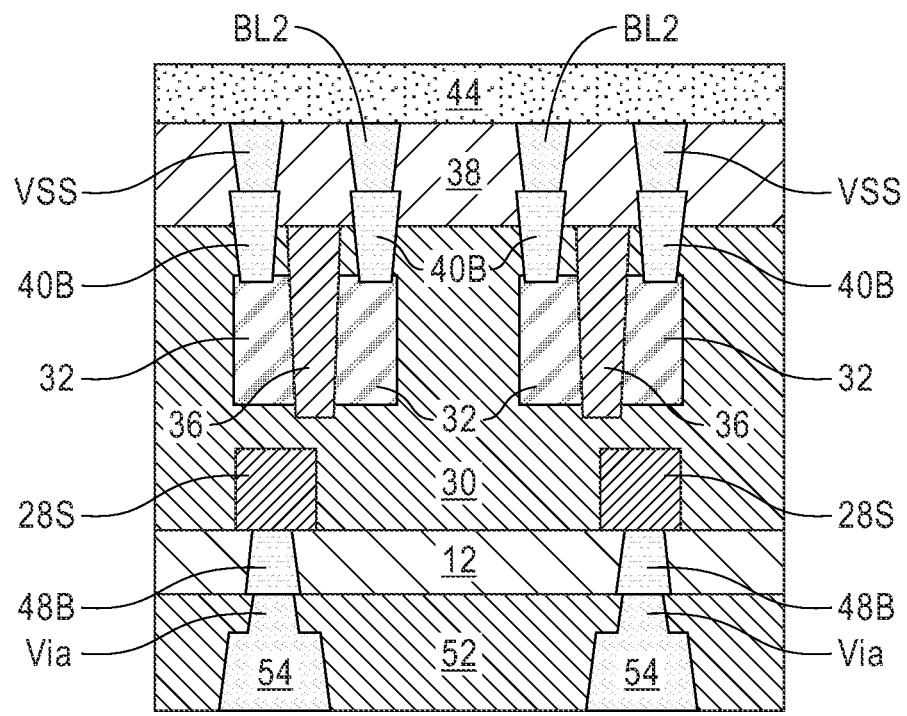
Figure 13A:
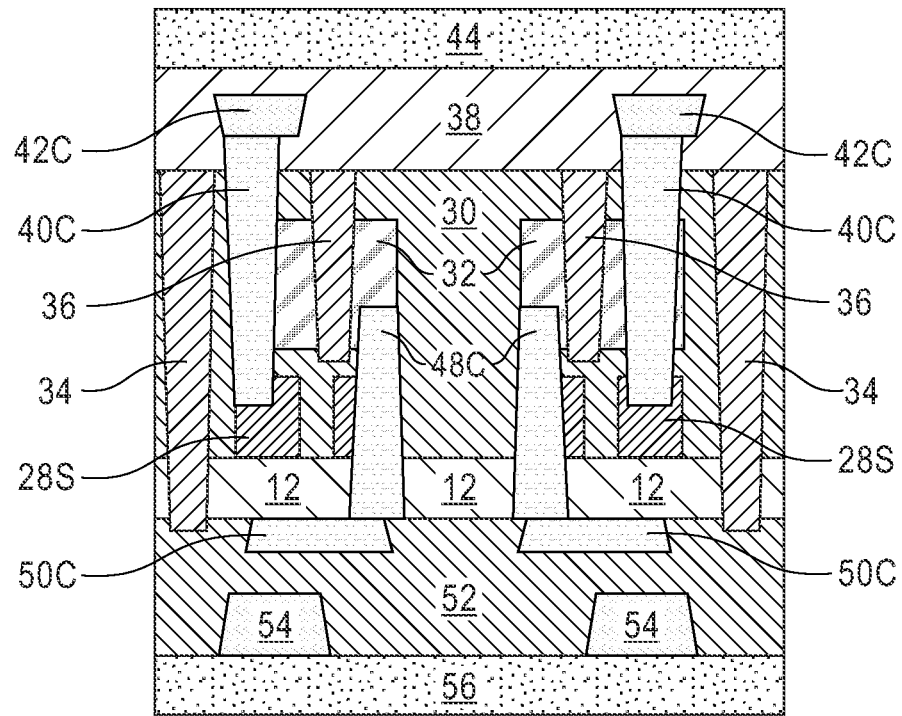
FIGS. 13A-13E are cross sectional views of the exemplary structure shown in FIGS. 12A-12E respectively, after forming a backside power delivery network (BSPDN).
Figure 13B:
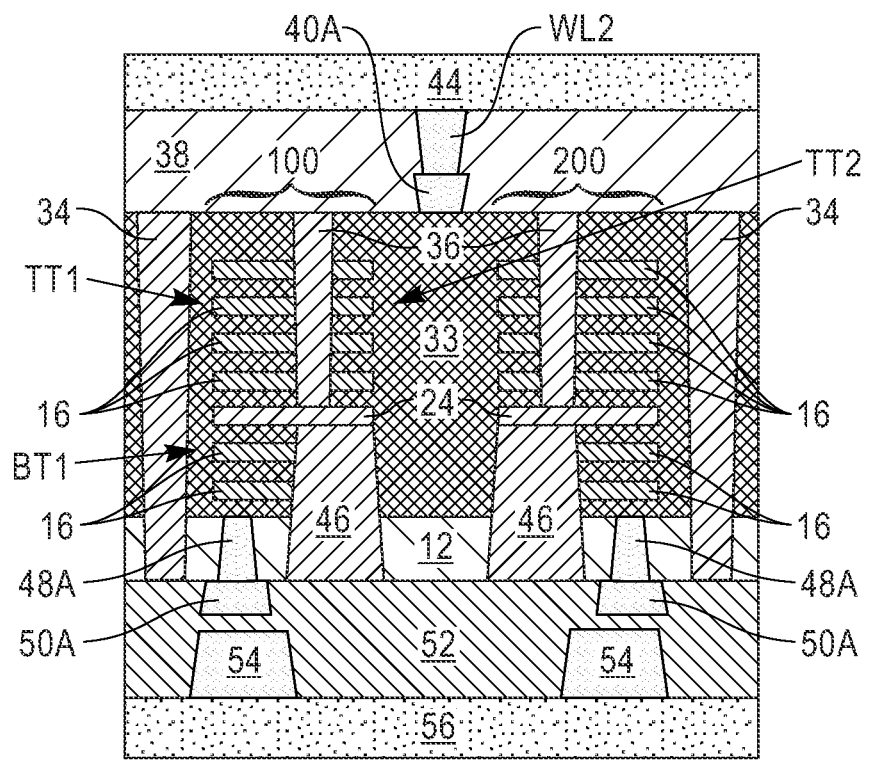
Figure 13C:
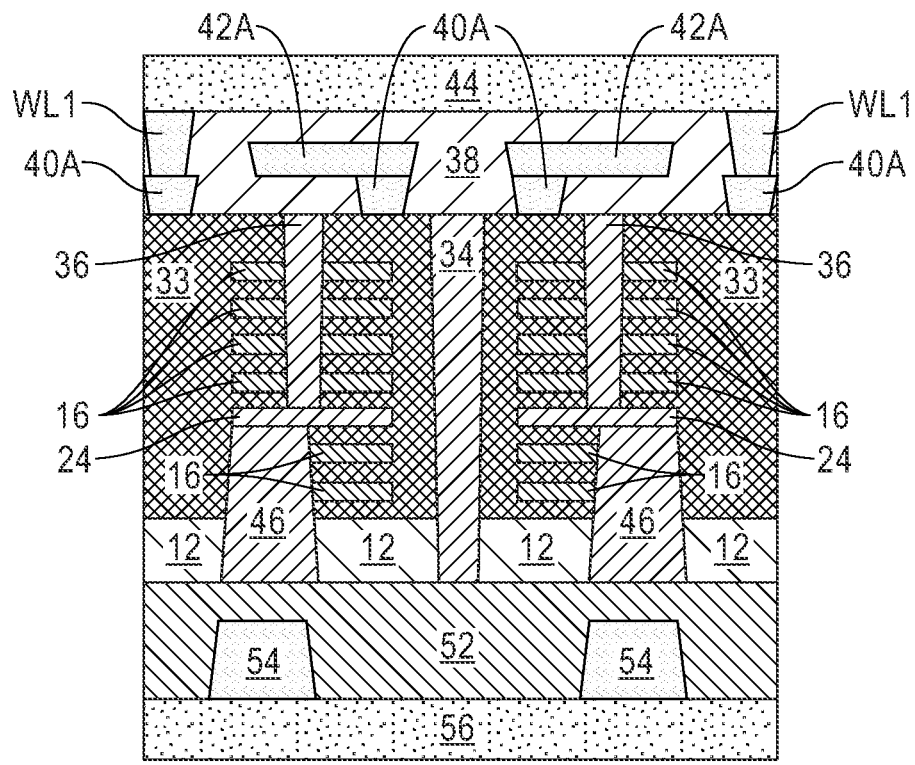
Figure 13D:
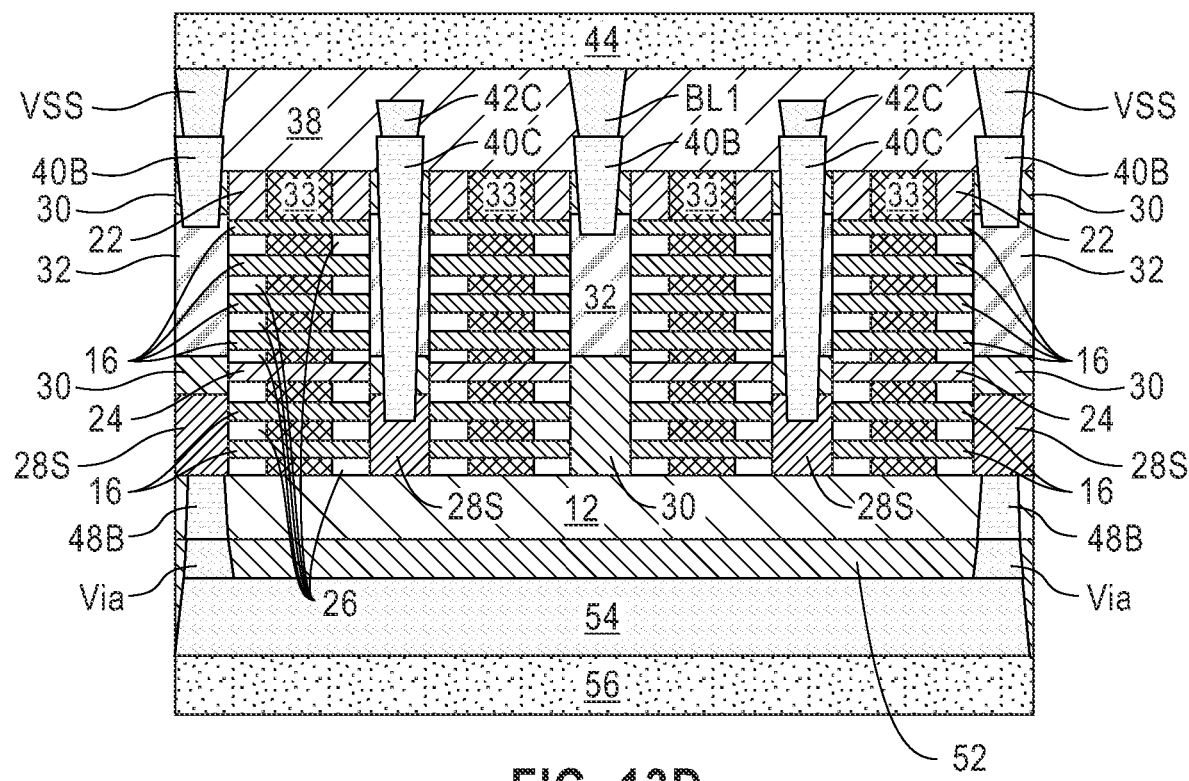
Figure 13E:
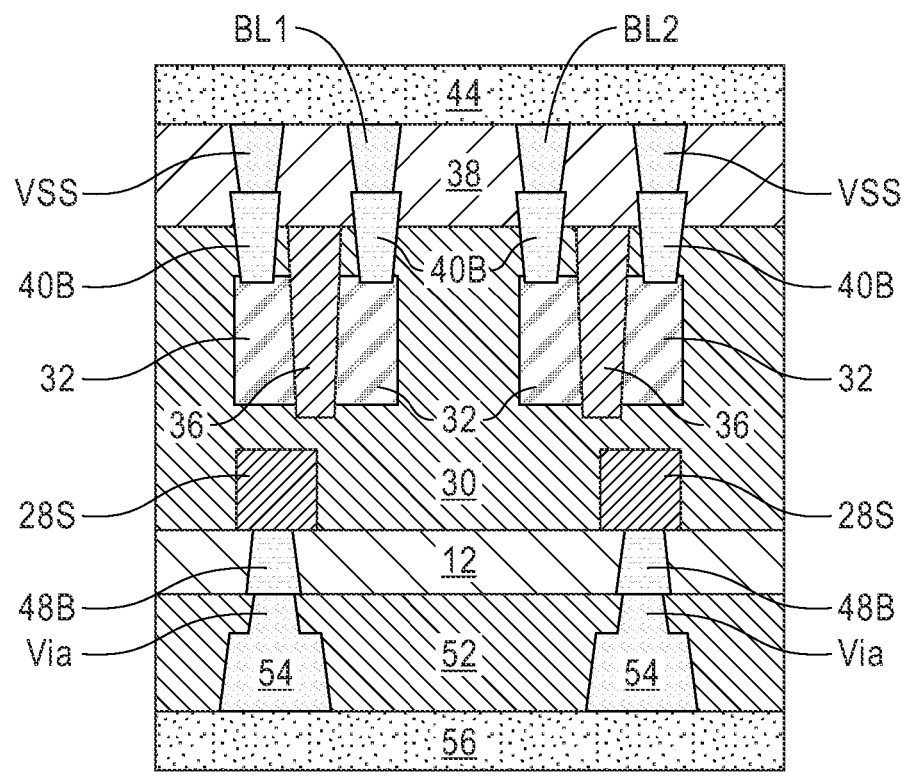

Referring now to FIGS. 10A-10E, there are illustrated the exemplary structure shown in FIGS. 9A-9E respectively, after forming at least one backside gate cut structure 46. The least one backside gate cut structure 46 removes a bottom portion of the gate structure 33 together with a portion of each semiconductor channel material nanosheet of the bottom nanosheet-containing material stack, NS1, as is shown in FIGS. 10B and 10C. As shown in FIG. 10C, three transistors are now provided for each stacked FET unit cell; two top transistors, TT1 and TT2, and one bottom transistor BT1. The two top transistors T1 and T2 are separated by the top gate cut structure 36, and the bottom transistor BT1 is separated from the two top transistors, TT1 and TT2, by dielectric material nanosheet 24. In the present application, a first top transistor (i.e., TT1) and the bottom transistor, BT1, of a given stacked field effect transistor device share a common gate structure 33, while the second top transistor, TT2, has an independent gate structure from that of TT1 and BT1. The second top transistor of an adjacent second stacked field effect device 102 can share a gate structure with TT2 of the first stacked field effect transistor device 100. The two top transistors, TT1 and TT2, together with bottom transistor BT1, of a given stacked field effect transistor device are components of a SRAM cell. In FIG. 10B, 6T SRAM is illustrated.

In the present application, the bottom transistor, BT1, is of a first conductivity type, while the two top transistors, TT1 and TT2, are of a second conductivity that differs from the first conductivity type. In some embodiments, the first conductivity type is p-type, while the second conductivity type is n-type. In other embodiments, the first conductivity type is n-type, while the second conductivity type is p-type.

The at least one backside gate cut structure 46 includes one of the dielectric materials mentioned above for providing the top gate cut structure 36, and the at least one backside gate cut structure 46 can be formed utilizing the same technique as mentioned above for forming the top gate cut structure 36. As is shown, the backside gate cut structure 46 has a bottommost surface that is coplanar with a bottommost surface of the dielectric material layer 12, and a topmost surface that contacts a surface of the dielectric material nanosheet 24.

Referring now to FIGS. 11A-11E, there are illustrated the exemplary structure shown in FIGS. 10A-10E respectively, after forming backside contact structures. Notably, a backside gate contact structure 48A, a backside bottom S/D contact structure 48B, and a backside shared S/D contact structure 48C are formed. The backside gate contact structure 48A and the backside bottom S/D contact structure 48B are formed within the dielectric material layer 12; thus the backside gate contact structure 48A and the backside bottom S/D contact structure 48B can be said to be embedded in the dielectric material layer 12. The backside shared S/D contact structure 48C is formed through the dielectric material layer 12, one of the bottom S/D structures 28S and a portion of the ILD material layer 30 stopping on a bottommost surface of one of the top S/D regions 32.

The backside gate contact structure 48A (which contacts a bottommost surface of gate structure 33), the backside bottom S/D contact structure 48B (which contacts a bottommost surface of one of the bottom S/D structures 28S) and the backside shared S/D contact structure 48C (which, for example, contacts a bottom S/D structure 28 of BT1 and a top S/D region 32 of TT1) can include one of the contact conductor materials mentioned above for the frontside contact structures. A conduct contact liner can optionally be formed prior to forming the backside contact structures. The backside contact structures can be formed by providing backside contact openings (typically by lithography and etching), filling the backside openings with at least the contact conductor material and the planarizing the structure to remove any contact conductor material that is formed outside the backside contact openings.

Referring now to FIGS. 12A-12E, there are illustrated the exemplary structure shown in FIGS. 11A-11E respectively, after forming backside cross couple structures 50A and 50C, a buried power rail (which serves as a Vdd structure in the present application) 54 and an interconnect dielectric material layer 52. The backside cross couple structures 50A and 50C includes one of the contact conductor materials mentioned above for the frontside contact structures. The backside cross couple structures 50A and 50C can be formed by forming a backside cross coupling opening in a previously deposited portion of the interconnect dielectric material layer 52, filling that opening with a contact conductive material and then planarizing the structure. The interconnect dielectric material layer 52 includes one of the dielectric materials mentioned above for the ILD material layer 30, and the interconnect dielectric material layer 52 can be formed utilizing one of the deposition techniques as mentioned above for forming the ILD material layer 30. In the present application, backside cross couple contact structure 50A (which could also be referred to as a backside gate cross couple contact structure) contacts the backside gate contact structure 48A, while the backside cross couple structure 50C (which could also be referred to as a backside shared S/D cross couple structure) contacts the backside shared S/D contact structure 48C.

The buried power rail 54 which can be formed in contact with the backside bottom S/D contact structure 48B can include any electrically conductive power rail material including, but not limited to, tungsten (W), cobalt (Co), ruthenium (Ru), aluminum (Al), copper (Cu), platinum (Pt), rhodium (Rh), or palladium (Pd). The buried power rail 54 can be formed within an opening that is formed into the interconnect dielectric material layer 54. Notably, the buried power rail 54 is formed by deposition of electrically conductive power rail material into the opening that is formed into the interconnect dielectric material layer 52. In embodiments, an electrically conductive via structure (labeled as "Via") can be used to electrically connect the buried power rail 54 to the backside bottom S/D contact structure 48B. The electrically conductive via structure can include one of the of the contact conductor materials mentioned above for the frontside contact structures. The electrically conductive via structure can be formed by forming a via opening into the interconnect dielectric material layer 53 and then filling the via opening with a contact conductor material as mentioned above. A planarization process can follow the via opening fill process.

Referring now to FIGS. 13A-13E, there are illustrated the exemplary structure shown in FIGS. 12A-12E respectively, after forming a backside power delivery network (BSPDN) 56. The BSPDN 56 includes materials/components that are well known to those skilled in the art, and it can be formed to the interconnect dielectric material layer 52 utilizing techniques that are also well known to those skilled in the art.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:
   a first stacked field effect transistor device present in a first device area, the first stacked field effect transistor device comprising two top transistors stacked above a single bottom transistor;
   a full gate cut structure located at the periphery of the first device area, and separating the first device area from an adjacent second device area;
   a top gate cut structure separating the two top transistors from each other; and
   a bottom gate cut structure located laterally adjacent to the single bottom transistor and beneath one of the top transistors.

2. The semiconductor device of claim 1, wherein each of the two top transistors wraps around at least one semiconductor channel material nanosheet of a top nanosheet-containing material stack, and the single bottom transistor wraps around at least one semiconductor channel material nanosheet of a bottom nanosheet-containing material stack.

3. The semiconductor device of claim 2, wherein a dielectric material nanosheet is present between the bottom nanosheet-containing material stack and the top nanosheet containing material stack.

4. The semiconductor device of claim 1, wherein a first top transistor of the two top transistors and the single bottom transistor share a shared gate structure, and a second top transistor of the two top transistors has a gate structure that is independent from the shared gate structure.

5. The semiconductor device of claim 4, further comprising a backside gate contact structure contacting a bottommost surface of the shared gate structure and a frontside gate contact structure a topmost surface of the shared gate structure.

6. The semiconductor device of claim 5, further comprising a backside gate cross couple contact structure contacting the backside gate contact structure, and a top gate cross couple structure contacting the frontside gate contact structure.

7. The semiconductor device of claim 4, further comprising a frontside shared source/drain (S/D) contact structure contacting a top S/D region of the first top transistor of the two top transistors and a bottom S/D structure of the single bottom transistor, and a backside shared gate contact structure contacting a bottom S/D structure and a top S/D region of the second top transistor.

8. The semiconductor device of claim 7, further comprising a backside shared S/D cross couple structure contacting the backside shared S/D contact structure, and a frontside shared S/D cross couple structure contacting the frontside shared S/D contact structure.

9. The semiconductor device of claim 1, wherein the two top transistors and the single bottom transistors are components of a SRAM cell.

10. The semiconductor device of claim 1, further comprising a frontside Vss power supply located above the two top transistors, and a backside Vdd power supply located beneath the single bottom transistor.

11. The semiconductor device of claim 1, further comprising a second stacked field effect transistor device present in the first device area and laterally adjacent to the first stacked field effect transistor device, the second stacked field effect transistor device comprising two top transistors stacked above a single bottom transistor, wherein another top gate cut structure separates the two top transistors of the second staked field effect transistor from each other and another bottom gate cut structure is located laterally adjacent to the single bottom transistor of the second stacked field effect device and beneath one of the top transistors of the second stacked field effect device.

12. The semiconductor device of claim 11, wherein the first stacked field effect device and the second field effect transistor device provide a 6T SRAM.

13. The semiconductor device of claim 1, further comprising a middle-of-the-line (MOL) dielectric material layer located above the two top transistors, a back-end-of-the-line (BEOL) structure located on the MOL dielectric material layer, and a carrier wafer located on the BEOL structure.

14. The semiconductor device of claim 1, further comprising a dielectric material layer located beneath the first stacked field effect transistor device.

15. The semiconductor device of claim 14, wherein the backside gate cut structure has a bottommost surface that is coplanar with a bottommost surface of the dielectric material layer.

16. The semiconductor device of claim 14, further comprising a backside power rail located beneath the dielectric material layer, the backside power rail is embedded in an interconnect dielectric material layer.

17. The semiconductor device of claim 16, further comprising a backside power delivery network located beneath the interconnect dielectric material layer.

18. The semiconductor device of claim 1, wherein the single bottom transistor is of a first conductivity type, and the two top transistors are of a second conductivity that is different from the first conductivity type.

19. The semiconductor device of claim 18, the first conductivity type is p-type and the second conductivity type is n-type.

20. The semiconductor device of claim 18, wherein the first conductivity type is n-type and the second conductivity type is p-type.

* * * * *